(12) United States Patent
Saha

(10) Patent No.: US 9,768,074 B2
(45) Date of Patent: Sep. 19, 2017

(54) TRANSISTOR STRUCTURE AND FABRICATION METHODS WITH AN EPITAXIAL LAYER OVER MULTIPLE HALO IMPLANTS

(71) Applicant: Samar K. Saha, Milpitas, CA (US)

(72) Inventor: Samar K. Saha, Milpitas, CA (US)

(*) Notice: Subject to any disclaimer, the term of this patent is extended or adjusted under 35 U.S.C. 154(b) by 0 days.

(21) Appl. No.: 15/083,172

(22) Filed: Mar. 28, 2016

(65) Prior Publication Data

US 2016/0211181 A1  Jul. 21, 2016

Related U.S. Application Data

(62) Division of application No. 14/229,102, filed on Mar. 28, 2014, now Pat. No. 9,299,702.

(60) Provisional application No. 61/881,908, filed on Sep. 24, 2013.

(51) Int. Cl.

| | | |
|---|---|---|
| *H01L 21/02* | (2006.01) | |
| *H01L 21/8238* | (2006.01) | |
| *H01L 29/78* | (2006.01) | |
| *H01L 29/10* | (2006.01) | |
| *H01L 21/265* | (2006.01) | |
| *H01L 27/092* | (2006.01) | |
| *H01L 21/205* | (2006.01) | |
| *H01L 21/225* | (2006.01) | |
| *H01L 21/266* | (2006.01) | |

(Continued)

(52) U.S. Cl.
CPC .. *H01L 21/823807* (2013.01); *H01L 21/0262* (2013.01); *H01L 21/2053* (2013.01); *H01L 21/2257* (2013.01); *H01L 21/266* (2013.01); *H01L 21/26513* (2013.01); *H01L 21/324* (2013.01); *H01L 21/823418* (2013.01); *H01L 21/823437* (2013.01); *H01L 21/823468* (2013.01); *H01L 21/823481* (2013.01); *H01L 21/823814* (2013.01); *H01L 21/823878* (2013.01); *H01L 27/092* (2013.01); *H01L 29/105* (2013.01); *H01L 29/1083* (2013.01)

(58) Field of Classification Search
CPC .............................................. H01L 21/823807
See application file for complete search history.

(56) References Cited

U.S. PATENT DOCUMENTS

| | | | |
|---|---|---|---|
| 6,756,276 B1 * | 6/2004 | Xiang | ................. H01L 29/1045 257/E21.409 |
| 9,299,702 B2 | 3/2016 | Saha | |

(Continued)

*Primary Examiner* — Victor A Mandala
*Assistant Examiner* — Regan J Rundio
(74) *Attorney, Agent, or Firm* — Bradley T. Sako

(57) ABSTRACT

A method of forming a transistor can include forming a gate mask on a substrate having a vertical location aligned with that of a transistor control gate; implanting first conductivity type dopants with the gate mask as an implant mask to form a first shallow halo region; implanting first conductivity type dopants with at least the gate mask as an implant mask to form a first deep halo region having a peak dopant concentration profile at a greater substrate depth than the first shallow halo region; forming an epitaxial layer on top of the substrate; forming a first control gate structure on the epitaxial layer; and forming a first source or drain region, of a second conductivity type, in at least the epitaxial layer to a side of the first control gate, and over the first shallow halo region and the first deep halo region.

20 Claims, 19 Drawing Sheets

(51) Int. Cl.
  *H01L 21/324*   (2006.01)
  *H01L 21/8234*  (2006.01)

(56) References Cited

U.S. PATENT DOCUMENTS

| | | | |
|---|---|---|---|
| 2011/0121404 A1* | 5/2011 | Shifren | H01L 21/823412 257/392 |
| 2012/0083076 A1* | 4/2012 | Wang | H01L 21/28194 438/151 |
| 2013/0244388 A1* | 9/2013 | Scheiper | H01L 21/823412 438/285 |
| 2015/0084108 A1 | 3/2015 | Saha | |

\* cited by examiner

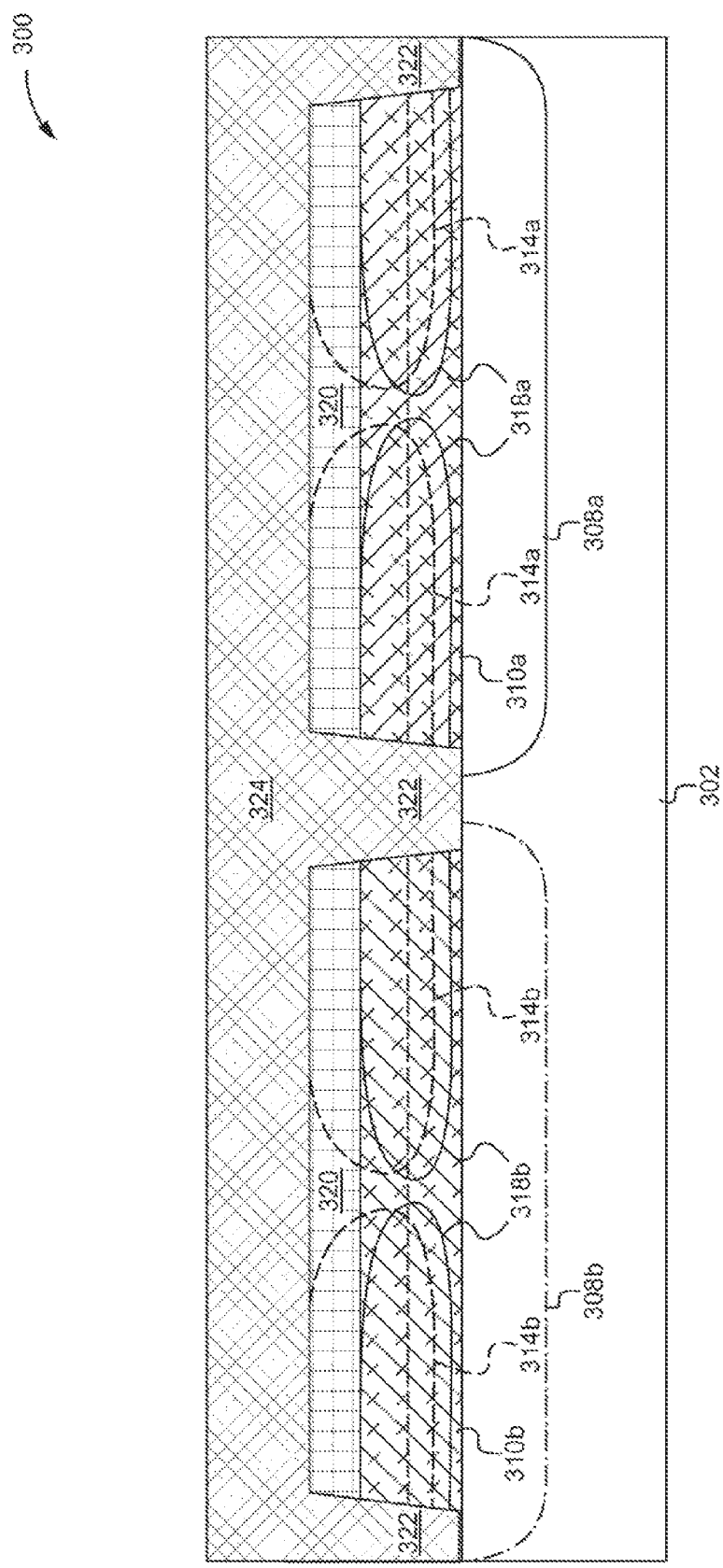

TRANSISTOR STRUCTURE AND FABRICATION METHODS WITH AN EPITAXIAL LAYER OVER MULTIPLE HALO IMPLANTS

RELATED APPLICATIONS

This application is a divisional of U.S. patent application Ser. No. 14/229,102, filed Mar. 28, 2014, and entitled, "Transistor Structure and Method with an Epitaxial Layer Over Multiple Halo Implants," which claims priority under 35 U.S.C. 119 (e) of U.S. Provisional Application Ser. No. 61/881,908, filed Sep. 24, 2013, and entitled "Transistor Structure and Method with Multiple Halo Implants and Epitaxial Layer." This application incorporates both of these patent applications in their entirety by reference.

FIELD OF THE INVENTION

The present invention is generally directed to the field of transistors in semiconductor substrates. More particularly, the present invention relates to transistors having an epitaxial layer above multiple halo implants.

BACKGROUND OF THE INVENTION

Today's semiconductor devices are continually being pushed to meet stricter demands in very large scale integrated (VLSI) circuits or integrated circuit (IC) chips. As these devices in VLSI circuits and systems or IC chips inundate the marketplace, consumers place higher demands on the devices. These demands include smaller, more compact devices with greater functionality. Semiconductor devices employ various circuitry in a chip to perform user specified functions. As is well known, the circuitry consists of various metallization lines, dielectric layers and other components interconnected throughout the entire chip. The metallization lines and other components are connected to transistors located at a lower level of the semiconductor device. The basic transistor has source and drain regions which are separated by a gate. By way of applying different voltages to the gate electrode, the transistor is either said to be ON or OFF.

Although there is a growing demand to scale transistor gate lengths to about 22 nm (i.e., 0.022 micron) and below for more demanding and compact digital circuit applications, such physical dimensions pose certain complexities. In particular, as transistors decrease in size the effects of process variability on the transistors continue to increase such that it is able to severely impact the functionality, yield and reliability of the transistors. For example, highly random effects that occur during processing of the transistors, such as random dopant fluctuations, oxide thickness variation and line-edge/width roughness, cause variability in the specific characteristics of each transistor. It is well known that variability increases with the decrease of transistor area. Thus, when the transistors are large, this variability only represents a small percentage of deviation in characteristics from transistor to transistor. However, as the transistors become smaller, that same level of variability becomes a larger and larger percentage of deviation to the point where the characteristics of one transistor can be substantially different than an identically designed second transistor. Thus, the process variability will only become a greater and greater concern as transistor dimensions are scaled down.

Another problem caused by the demand for smaller physical dimensions is the transistor off-state leakage current. Specifically, there is a need to cutoff leakage current of the order of zero in the off-state, and to produce low resistance or high device current in the on-state. However, for small gate length devices, even in the off-state, the space-charge region near the drain touches the source in a deeper place where the gate bias cannot control the potential, resulting in leakage current from the source to drain via the space-charge region. This is known as short-channel effect (SCE) which causes degradation in threshold voltage (Vth). As can be understood, for a transistor to work as a component of a digital circuit, the capability of switching OFF or the suppression of SCE is of high importance.

Yet another problem with the manufacturing of sub-22 nm transistors is the susceptibility to punch through. Punch through is generally understood to mean a case in which a dopant annealing process causes the source and drain depletion regions to come together. Since sub-22 nm transistors are pushing the limits on semiconductor manufacturing, transistor shorting or leakage due to punch through is a problem that needs to be addressed.

SUMMARY OF THE INVENTION

A transistor structure having an epitaxial layer deposited over the implanted substrate in order to reduce process variability. In particular, the epitaxial layer is able to be un-doped (or lightly doped via up-diffusion from the implanted substrate) and used to form the channel for the transistor structure. As a result, this use of un-doped epitaxial layer provides the benefit of reducing process variability (e.g. random dopant fluctuations) and thus the transistor performance variability despite the small physical size of the transistors. The implanted substrate has a first polarity and is able to comprise a deep well implant having the first polarity defined at a first depth, a threshold voltage-adjust implant of the same polarity at a second depth shallower than the first depth, a shallow halo implant of the first polarity defined at a third depth shallower than the first depth and deeper than the second depth, and a deep halo implant of the same polarity as the substrate defined at a fourth depth deeper than the third depth of the shallow halo implant. The shallow halo implant and the deep halo implant allow a peak concentration of substrate impurities at a level below the gate such that the resistance of the transistor is minimized along with the threshold voltage, threshold voltage fluctuations, short channel effects, and leakage current in the transistor. The transistor structure is able to be n-channel metal oxide semiconductor (NMOS), p-channel metal oxide semiconductor (PMOS) or other types of transistor structures. In some embodiments, the structure is able to be characterized as a buried halo (BH) metal-oxide-semiconductor field effect transistor (BH-MOSFET).

A first aspect is directed to a transistor structure. The structure comprises a first control gate, a semiconductor substrate doped to a first conductivity type, a first shallow halo implant region of the first conductivity type at a first depth in a portion of the substrate that at least partially extends under the first control gate, a first deep halo implant region of the first conductivity type at a second depth in a portion of the substrate that at least partially extends under the first control gate, wherein the second depth is greater than the first depth, an epitaxial layer formed on top of the substrate and below the first control gate and a first source region and a first drain region both of a second conductivity type and formed in the epitaxial layer over the first shallow halo implant and the first deep halo implant and to the sides of the first control gate. In some embodiments, the semiconductor substrate comprises silicon. In some embodiments, the structure further comprises a first well of the first conductivity type formed in the substrate, wherein the first shallow halo implant region, the first deep halo implant region, the source region and the drain region are formed in the first well. In some embodiments, the structure further comprises a second well of a second conductivity type formed in the substrate, a second control gate formed over the second well, a second shallow halo implant region of the second conductivity type at the first depth in a portion of the substrate that at least partially extends under the second control gate, a second deep halo implant region of the second conductivity type at the second depth in a portion of the substrate that at least partially extends under the second control gate and a second source region and a second drain region both of the first conductivity type and formed in the epitaxial layer over the second shallow halo implant and the second deep halo implant and to the sides of the second control gate, wherein the epitaxial layer is further formed on the second well below the second control gate. In some embodiments, the structure further comprises a threshold voltage adjust region of the first conductivity type formed in the substrate that extends lower than the deep halo implant region. In some embodiments, the structure further comprises a threshold voltage adjust region that extends into but not above the shallow halo implant region. In some embodiments, the epitaxial layer is undoped at least below the first control gate. In some embodiments, the epitaxial layer is lightly doped at least below the first control gate such that the level of doping of the epitaxial layer is less than any first conductivity type doping of the substrate. In some embodiments, the first shallow halo implant region extends into at least a portion of the epitaxial layer. In some embodiments, the first deep halo implant region extends into at least a portion of the epitaxial layer.

A second aspect is directed to a method of providing a transistor. The method comprises forming a gate mask on a substrate having a vertical location aligned with that of a transistor control gate, implanting first conductivity type dopants with the gate mask as an implant mask to form a first shallow halo region, implanting first conductivity type dopants with at least the gate mask as an implant mask to form a first deep halo region, forming an epitaxial layer on top of the substrate, forming a control gate structure on the epitaxial layer and forming a source region and a drain region both of a second conductivity type over the first shallow halo region and the first deep halo region. In some embodiments, the method further comprises forming a first well of the first conductivity type in the substrate, wherein the gate mask is formed over the first well. In some embodiments, the method further comprises forming a second well of the second conductivity type in the substrate, forming a second gate mask over the second well, implanting dopants of the second conductivity type with the second gate mask as an implant mask to form a second shallow halo region, implanting dopants of the second conductivity type with at least the second gate mask as an implant mask to form a second deep halo region, forming a second control gate structure on the epitaxial layer above the second well and forming a second source region and a second drain region both of the first conductivity type over the second shallow halo region and the second deep halo region. In some embodiments, the method further comprises prior to forming the first shallow halo region, forming one or more mini-spacers on the gate mask. In some embodiments, the method further comprises prior to forming the first deep halo region, forming one or more spacers on the gate mask. In some embodiments, the method further comprises prior to forming the first shallow halo region, forming a threshold voltage adjust region at depth greater than the first shallow halo region and shallower than the first deep halo region. In some embodiments, the method further comprises patterning the epitaxial layer and the substrate to form active areas. In some embodiments, the method further comprises separating the substrate and the epitaxial layer with one or more electrically isolating structures to form active areas. In some embodiments, the isolation structures are shallow trench isolation structures. In some embodiments, forming the control gate structure on the epitaxial layer comprises forming a gate insulator on a surface of the epitaxial layer, forming a gate electrode material on the gate insulator and patterning the gate insulator and the gate electrode material to form the control gate structure. In some embodiments, forming the gate insulator comprises growing a thermal oxide on a surface of the epitaxial layer and/or depositing a high-K dielectric gate oxide on the surface of the epitaxial layer. In some embodiments, forming the source region and the drain region comprises implanting dopants of the second conductivity type with at least the control gate structure as an implant mask. In some embodiments, the method further comprises prior to forming the source region and the drain region, forming spacers on sides of the control gate structure, wherein the spacers forming another portion of an implant mask. In some embodiments, the method further comprises annealing to diffuse dopants into the epitaxial layer from one or more of the shallow halo region, the deep halo region and a threshold voltage adjust region. In some embodiments, the annealing is performed via a rapid thermal anneal. In some embodiments, the annealing is performed via a laser thermal anneal.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 3K illustrates deposition and etching processes of insulating or separating the active areas of the substrate 302 according to some embodiments.

FIGS. 3N and 3O illustrate a source drain extension (SDE) implant process according to some embodiments.

DETAILED DESCRIPTION OF THE EMBODIMENTS

Embodiments of the application are directed systems, devices and methods of making a transistor structure having an epitaxial layer on top of a doped substrate such that the epitaxial layer is able to be un-doped or lightly doped thereby reducing process variability (e.g. random dopant variability in the channel and/or other regions) in the transistor structure. In particular, the epitaxial layer enables the transistor structure to have optimized source-drain and/or channel regions to mitigate the risk of process variability in device and circuit performance despite shrinking transistor dimensions. The transistor structure is also able to comprise a plurality of halo regions at varying depths that enable a peak concentration of substrate impurities at a level below the gate such that the resistance of the transistor is minimized along with the threshold voltage, threshold voltage fluctuations, short channel effects, and leakage current in the transistor. The halo implants along with the Vth adjust implant/layer form a super-steep retrograde (SSR) channel doping profile with peak concentration below the surface of the channel region. These benefits are able to be produced in transistor structures even with gate length sizes in the range of about 22 nm and below. In some embodiments, the transistor structures are able to be accurately characterized as buried-halo (BH) MOSFETs.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. Reference will now be made in detail to implementations of the transistor structure and method of making the transistor structure as illustrated in the accompanying drawings. The same reference indicators will be used throughout the drawings and the following detailed description to refer to the same or like parts. In the interest of clarity, not all of the routine features of the implementations described herein are shown and described. It will of course be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
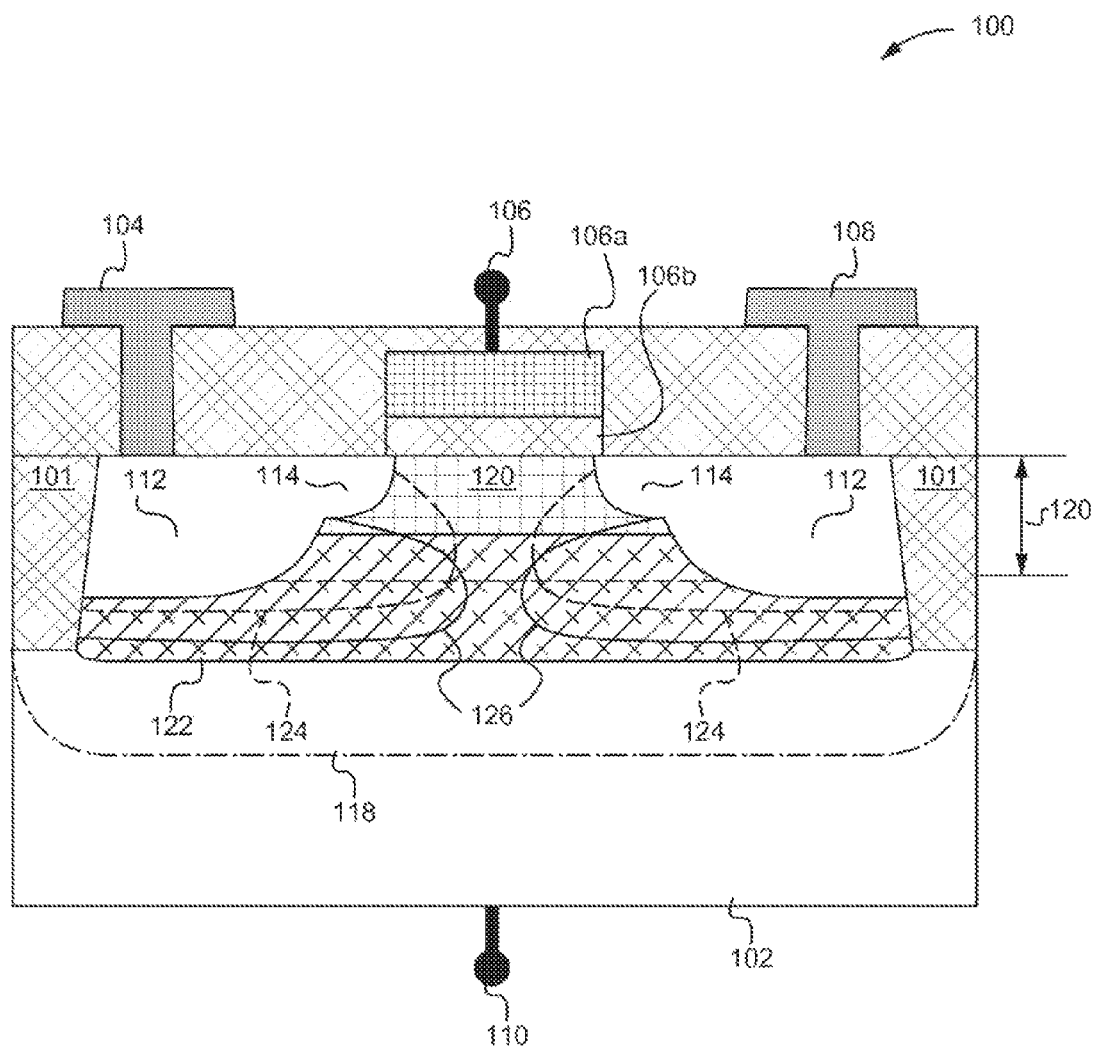
FIG. 1 illustrates a transistor having multiple halos according to some embodiments.

FIG. 1 illustrates a transistor 100 having multiple halos according to some embodiments. Although FIG. 1 shows an n-channel device, it is understood that the transistor 100 is able to be p-channel device comprising opposite polarity dopants such that the transistor 100 is able to be either an NMOS type transistor or a PMOS type transistor depending on the polarity of the substrate, the well region, the Vth adjust region, the halo regions and/or the source-drain diffusion regions to be formed. As shown in FIG. 1, the transistor 100 comprises isolation elements 101, a p-substrate 102, a source 104, a gate 106, a drain 108 and a body 110. The gate 106 is able to comprise a body 106a coupled to a gate insulator 106b. In some embodiments, the body 106a is polysilicon. Alternatively, the body 106a is able to comprise metal, polysilicon, a combination thereof or other types of gate materials well known in the art. In some embodiments, the gate body 106a has a thickness of between 500 Å and 3,000 Å Alternatively, the gate body 106a is able to have a thickness of 1,000 Å. The gate body 106a is able to have a length between 6 nm and 10,000 nm. Alternatively, the gate body 106a is able to have a length between 14 nm and 60 nm, for example, 22 nm. In some embodiments, the gate insulator 106b is a gate oxide. Alternatively, the gate insulator 106b is able to comprise other types of insulating materials or combinations thereof including oxides. In some embodiments, the gate insulator 106b has an effective thickness of between 10 Å and 100 Å. For example, the insulator 106b is able to have an effective thickness of 15 or 20 Å.

As shown in FIG. 1, the substrate 102 comprises one or more deep source-drain regions 112 (DSD), one or more shallow source-drain extensions 114 (SDE), a well 118, a Vth adjust layer 122, one or more shallow halo implants 124 and one or more deep halo implants 126 formed in the substrate 102. In particular, the DSDs 112 are able to be n+-type source-drain regions, the SDEs are able to be n+-type source-drain extensions, well 118 is able to be a p-type well, Vth adjust implant 122 is able to be a p-type layer, the shallow implants 124 are able to be p-type shallow halo implants 124 and the deep implants 126 are able to be p-type deep halo implants 126. Alternatively, the polarity of the above elements is able to be switched for a p-channel device as described above. The DSDs 112 are able to extend from the surface of the substrate 102 down to just above the deep halo implants 126. The impurities used to form the DSDs 112 are able to vary depending on whether the transistor 100 is to be an NMOS type transistor or a PMOS type transistor as is well known in the art. For an NMOS type transistor, the impurities that form the DSDs 112 are able to be Arsenic, Phosphorus or other types of impurities as are well known in the art. The concentration of the impurities that form the DSDs 112 for an NMOS type transistor is able to range from $1 \times 10^{20}$ atoms/cm$^3$ to $5 \times 10^{20}$ atoms/cm$^3$ (e.g. $3 \times 10^{20}$ atoms/cm$^3$). Alternatively, for a PMOS type transistor, the impurities that form the DSDs 112 are able to be Boron, Boron difluoride (BF$_2$) or other types of impurities well known in the art. The concentration of the impurities that form the DSDs 112 for a PMOS type transistor is able to range from $8 \times 10^{19}$ atoms/cm$^3$ to $2 \times 10^{20}$ atoms/cm$^3$ (e.g. $1 \times 10^{20}$ atoms/cm$^3$).

The SDEs 114 are able to be positioned such that at least a portion of the SDEs 114 is underneath the gate 106 using optional mini SDE offset spacers (not shown). Specifically, the SDEs 114 are able to be positioned within the substrate 102 immediately above the shallow halo implants 124 to further suppress short channel effects such as source/drain leakage currents. Like the DSDs 112, the impurities used to form the SDEs 114 are able to vary depending on whether the transistor 100 is to be an NMOS type transistor or a PMOS type transistor as is well known in the art. For an NMOS type transistor, the impurities that form the SDEs 114 are able to be Arsenic, Phosphorus or other types of impurities as are well known in the art. The concentration of the impurities that form the SDEs 114 for a NMOS type transistor is able to range from $1\times10^{20}$ atoms/cm$^3$ to $5\times10^{20}$ atoms/cm$^3$ (e.g. $3\times10^{20}$ atoms/cm$^3$).

Alternatively, for a PMOS type transistor, the impurities that form the SDEs 114 are able to be Boron, Boron difluoride or other types of impurities well known in the art. The concentration of the impurities that form the SDEs 114 for a PMOS type transistor is able to range from $8\times10^{19}$ atoms/cm$^3$ to $2\times10^{20}$ atoms/cm$^3$ (e.g. $1\times10^{20}$ atoms/cm$^3$). As a result, DSDs 112 and/or the SDEs 114 define the transistor 100 structure such that when gate 106 is turned ON with lower Vth due to supply gate bias in the range of about 1V, an inversion layer can be formed and current will flow from one DSD 112 and/or SDE 114 to another DSD 112 and/or SDE 114 with reduced resistance. Additionally, it is again noted that the polarity of the DSDs 112 and the SDEs 114 is opposite to the channel region. In particular, this is pointed out to contrast the polarity of the halo implants 124, 126 described below, which is the same as the channel region.

The shallow halo implants 124 are able to be positioned such that they at least partially extend below the SDEs 114, DSDs 112 and/or the gate 106. The deep halo implants 126 are able to be positioned such that they at least partially extend below the SDEs 114, DSDs 112 and/or the gate 106, as well as extending at least partially below the shallow halo implants 124. As a result, the shallow and/or deep halo implants 124, 126 are able to assist in suppressing the leakage currents that are a result of the short channel effect (SCE). In particular, the SCE can render a transistor non-functional if too much leakage current is present. The use and positioning of the shallow and/or deep halo implants 124, 126 within the transistor 100 at a depth that is apart from the surface of the substrate 102 avoids creating high level concentrations (of the same polarity as the channel region) just below the gate 106 in the substrate channel region, which leads to increased Vth and channel resistance.

The impurities used to form the shallow halo implants 124 are able to vary depending on whether the transistor 100 is to be an NMOS type transistor or a PMOS type transistor. Specifically, the shallow halo implants 124 comprise impurity types of the same polarity as the channel polarity. For example, for an NMOS type transistor, the halo implants 124 will be P-type impurities. In some embodiments, the impurities of the shallow halo implants 124 are able to have low diffusion coefficients such as indium, boron, phosphorus, arsenic, antimony or other types of impurities with low diffusion coefficients. Alternatively, other types of impurities having low or higher diffusion coefficients are able to be used. In some embodiments, the impurities are implanted within the substrate 102 at a peak concentration ranging preferably from $1\times10^{18}$ atoms/cm$^3$ to $1\times10^{19}$ atoms/cm$^3$ (e.g. $5\times10^{18}$ atoms/cm$^3$). However, it should be noted that the concentration of the impurities implanted are able to differ from the actual concentration of the impurities in the shallow halo implants 124 due to losses and the diffusion process as the impurities enter the substrate 102. As a result, the actual concentration is able to range from $1\times10^{18}$ atoms/cm$^3$ to $6\times10^{18}$ atoms/cm$^3$ (e.g. $3\times10^{18}$ atoms/cm$^3$).

The impurities used to form the deep halo implants 126 are also able to vary depending on whether the transistor 100 is to be an NMOS type transistor or a PMOS type transistor. In particular, similar to the shallow halo implants 124, the deep halo implants 126 comprise impurity types of the same polarity as the channel polarity. For example, for a PMOS type transistor, the deep halo implants 126 will be N-type impurities. In some embodiments, the impurities of the deep halo implants 126 are able to have low diffusion coefficients such as indium, boron, phosphorus, arsenic, antimony or other types of impurities with low diffusion coefficients. Alternatively, other types of impurities having low or higher diffusion coefficients are able to be used. In some embodiments, the concentration ranges of the impurities implanted to form the deep halo implants 126 are able to be slightly lower than those of the shallow halo implants 124. For example, the peak impurity concentration of the deep halo implants 126 is able to range between $1\times10^{18}$ atoms/cm$^3$ and $5\times10^{18}$ atoms/cm$^3$ (e.g. $2.5\times10^{18}$ atoms/cm$^3$). In particular, the peak concentration of deep halo implants 126 are positioned just below the DSD junctions described above. As a result, the deep halo implants 126 are able to further reduce the leakage from the deeper channel region where the gate bias cannot control the potential. Thus, shallow and deep halo implants 124, 126 are able to allow a peak concentration of substrate impurities at a level below the gate 106, such that the resistance of the transistor 100 is able to be minimized along with the threshold voltage, threshold voltage fluctuations, short channel effects, and leakage current in the transistor 100. Additionally, it is noted that shallow and/or deep halo implants 124, 126 are able to have a low concentration of impurities at the top and bottom of the implants 124, 126 and a peak concentration region in the middle of the implants 124, 126. In some embodiments, the substrate 102 is able to comprise a p-type Vth adjust layer 122 formed below the transistor 100 channel which is able to adjust the threshold voltage of the transistor 100.

The undoped epitaxial layer 120 (EPI) is able to be deposited on top of the substrate 102 in order to form the channel region. In particular, the epitaxial layer 120 is able to be deposited on top of the substrate 102 after the substrate 102 has been doped to form the wells 118, the Vth adjust layer 122 and the halos 124, 126. Accordingly, the wells 118, the Vth adjust layer 122, and the halos 124, 126 are buried under the epitaxial layer 120, which is then covered in the channel region by the gate 106 during implanting of the DSDs 112 and SDEs 114. As a result, the epitaxial layer 120 is able to remain un-doped or only lightly doped (due to up-diffusion of dopants from the halos and Vth adjust implant within the substrate 102) especially, below the gate 106 in the channel region. The epitaxial layer 120 thereby provides the benefit of reducing the process variability of the transistor 100 particularly in the channel region.

Figure 2:
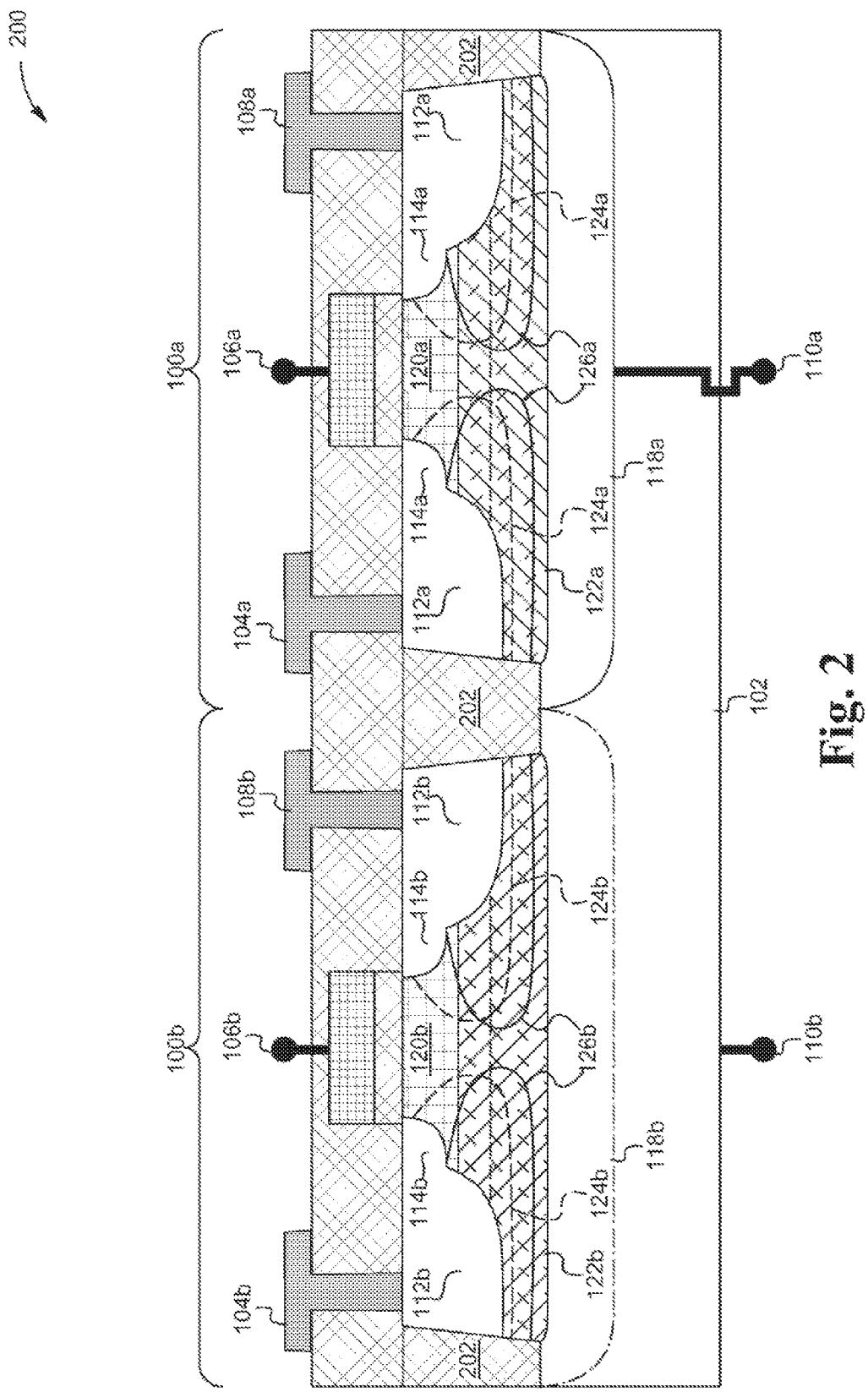
FIG. 2 illustrates a complimentary transistor structure with a plurality of transistors each having multiple halos according to some embodiments.

FIG. 2 illustrates a complimentary transistor structure 200 with a plurality of transistors 100a, 100b each having multiple halos according to some embodiments. Each transistor 100a, 100b of the transistor structure 200 of FIG. 2 is able to be substantially similar to the transistor 100 described in FIG. 1 except for the differences described herein. In particular as shown in FIG. 2, a plurality of transistors 100a, 100b are formed adjacent to each other on a single substrate 102 and separated by an isolation element 202. In some embodiments, the isolation element 202 is a shallow trench isolation (STI). Alternatively, the isolation element 202 is able to comprise other types of isolating structures. In some embodiments, the transistor 100b is an n-channel transistor (e.g. NMOS) and the transistor 100a is a p-channel transistor (e.g. PMOS). It is noted that the transistor 100a is substantially similar to the transistor 100b and the transistor 100 in FIG. 1 except with opposite polarity of components/doping in order to form a p-channel instead of an n-channel. Alternatively, the plurality of transistors are able to comprise any combination of n-channel and/or p-channel transistors on a single substrate.

As shown in FIG. 2, the substrate 102 is a p-type substrate. Alternatively, the substrate 102 is able to be an n-type substrate wherein the doping of the transistors 100a, 100b is adjusted accordingly as described above. As a result, n-channel transistors and/or one or more p-channel transistors formed in a p-type substrate. Alternatively, in some embodiments the structure 200 comprises one or more n-channel transistors and/or one or more p-channel transistors formed in a n-type substrate. In some embodiments, the structure 200 comprises one or more additional wells to form one or more twin or triple well structures within the substrate 102. For example, an n-channel transistor of the transistors 100 is able to be formed in a p-well that is itself formed in an n-well. Accordingly, the transistor structure 200 is able to form a complimentary transistor structure 200 such as a complementary-metal-oxide-semiconductor (CMOS). Alternatively, the structure 200 is able to comprise other transistor structures having any combination of any number of p-type and/or n-type transistors. Thus, it is understood that transistors 100a, 100b of the structure 200 are able to be used as complementary devices and/or as conventional transistors.

Figure 3A:
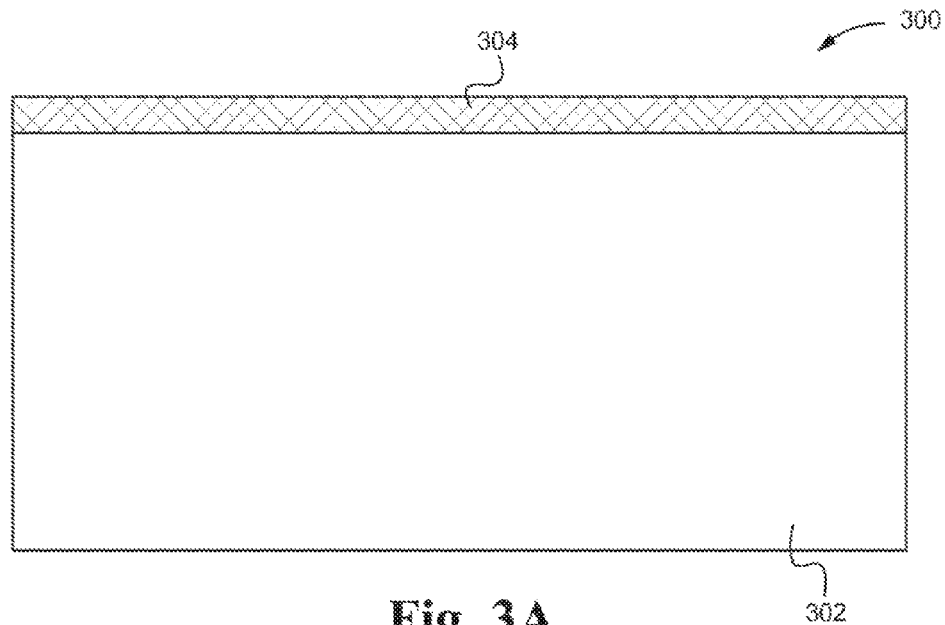
FIG. 3A illustrates an initial oxide grown on a substrate according to some embodiments.
Figure 3B:
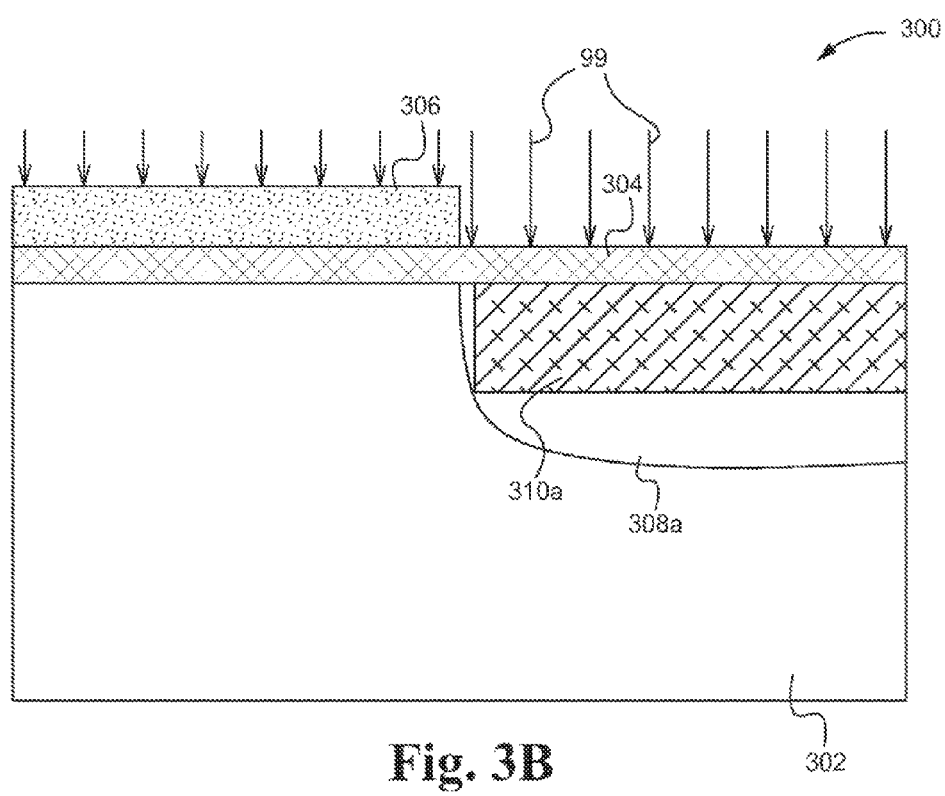
FIGS. 3B and 3C illustrate the well and threshold voltage adjust layer implant processes according to some embodiments.
Figure 3C:
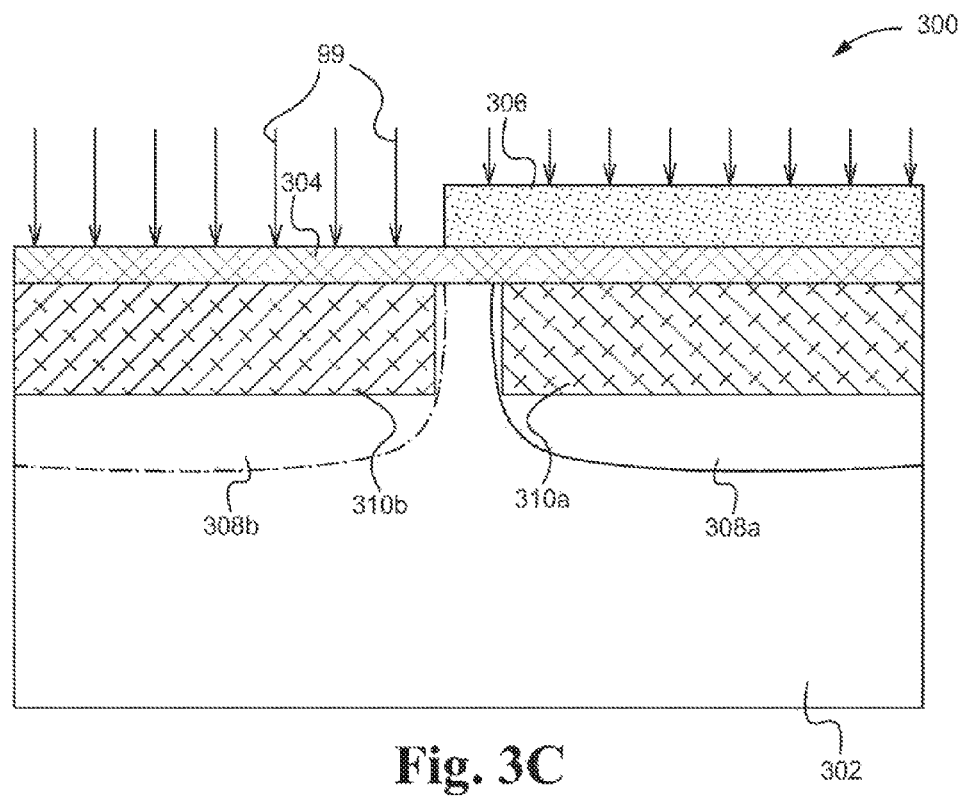
Figure 3D:
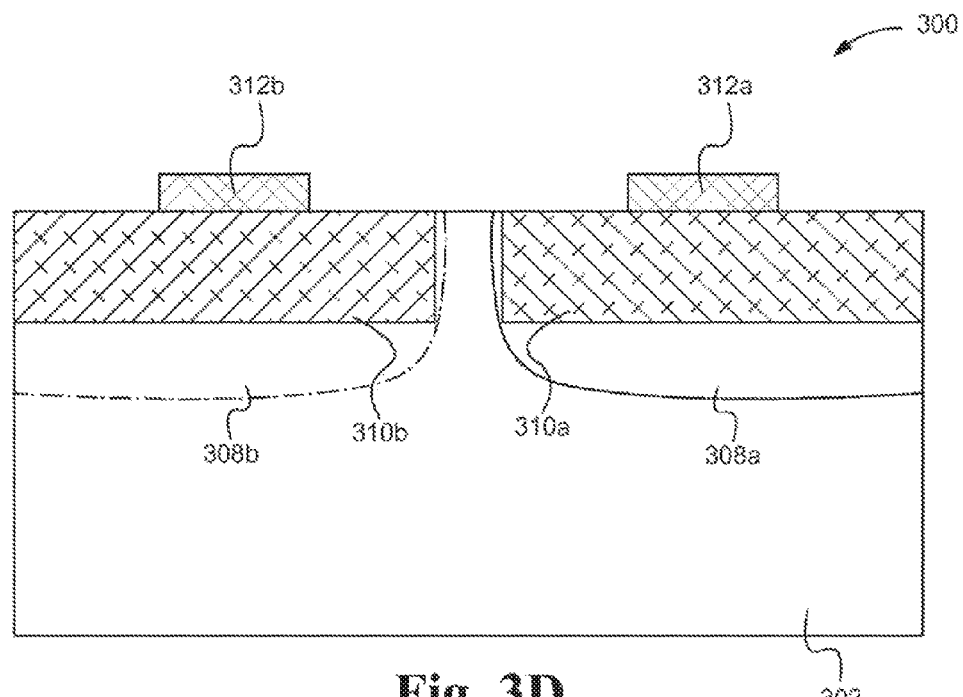
FIGS. 3D-3F illustrate first or shallow halo implant processing according to some embodiments.
Figure 3E:
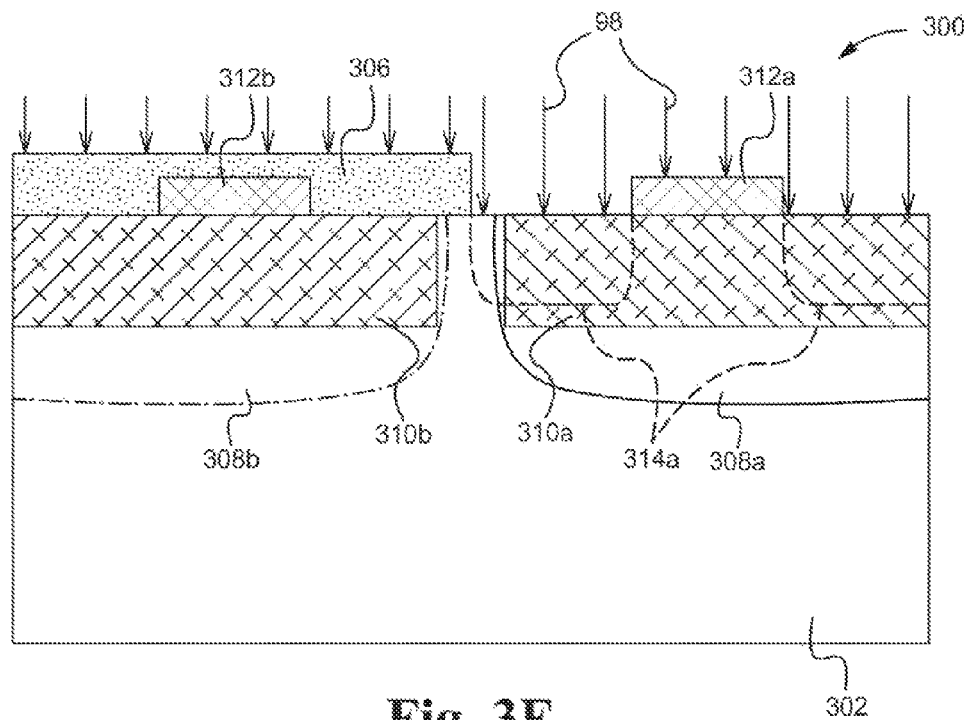
Figure 3F:
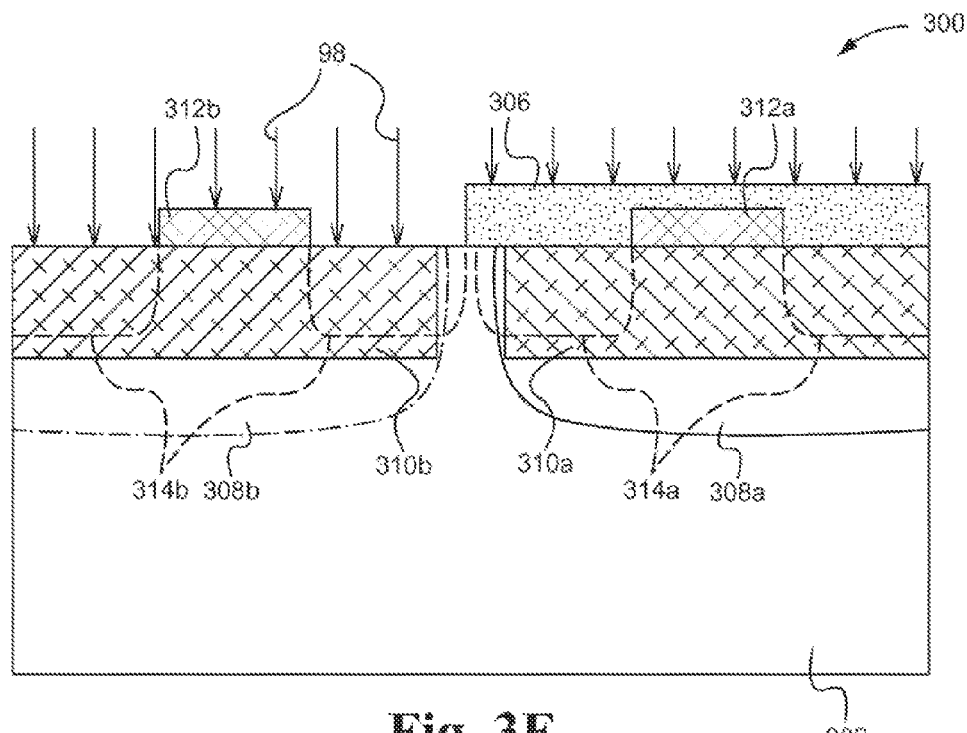
Figure 3G:
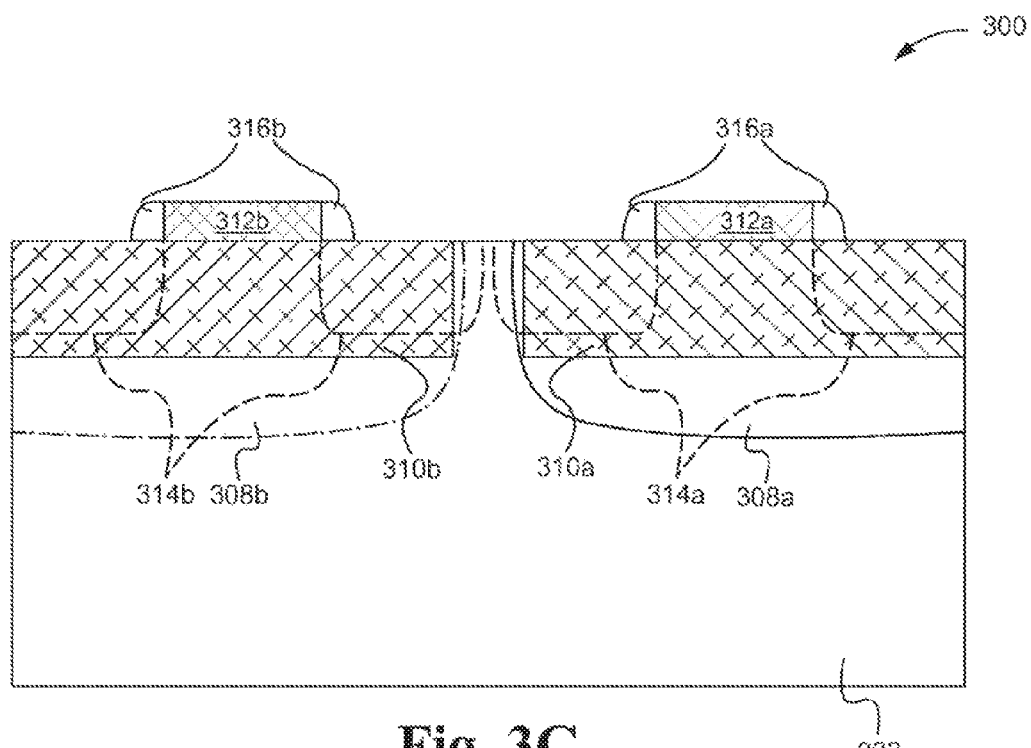
FIGS. 3G-3I illustrate second or deep halo implant processing according to some embodiments.
Figure 3H:
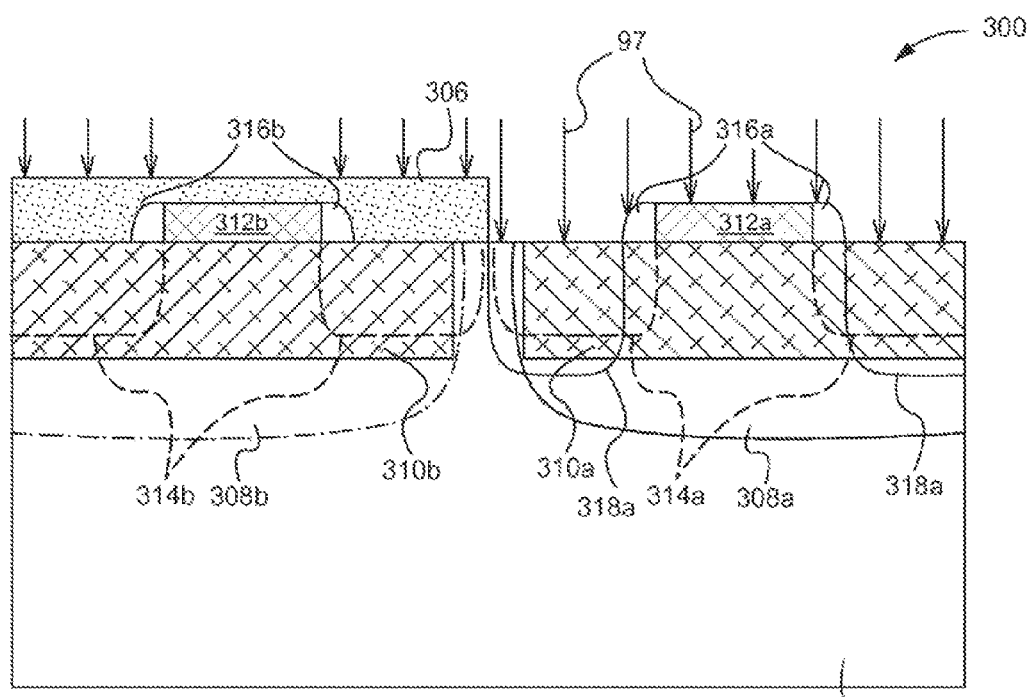
Figure 3I:
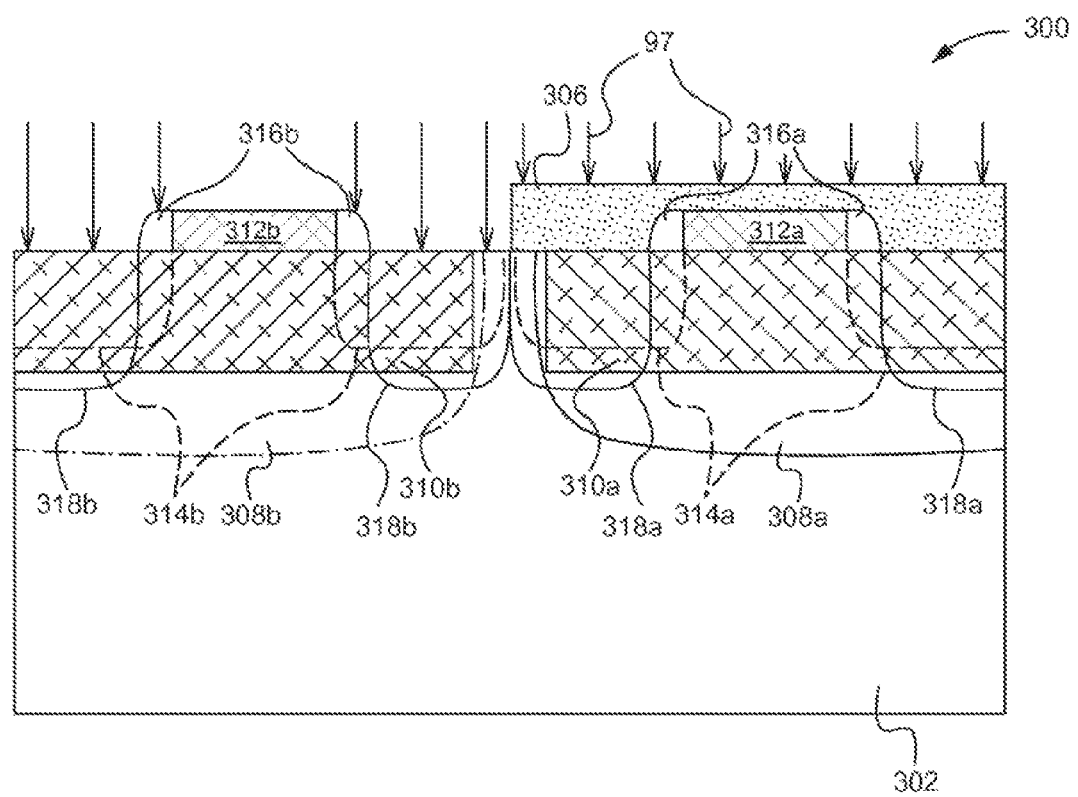
Figure 3J:
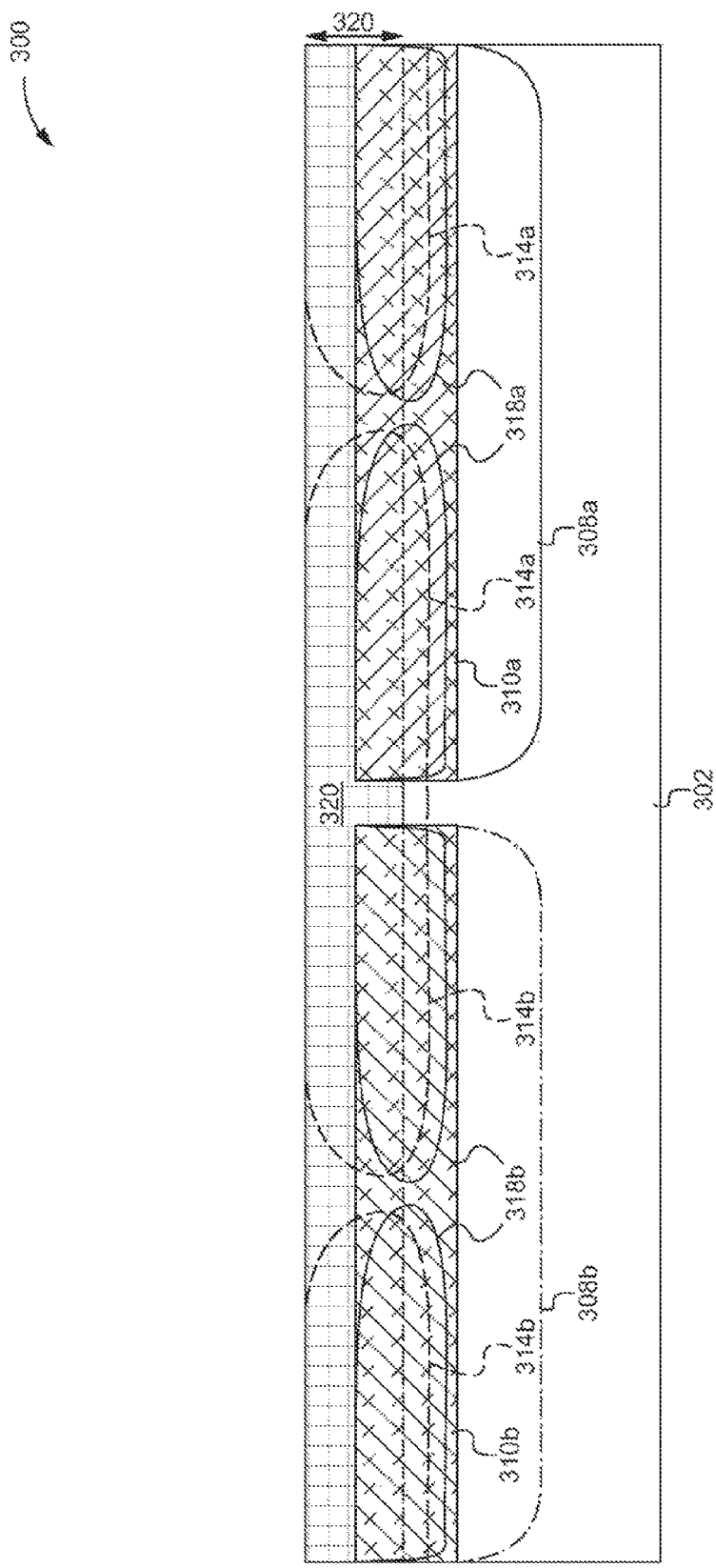
FIG. 3J illustrates a process of forming an epitaxial layer on the substrate according to some embodiments.
Figure 3L:
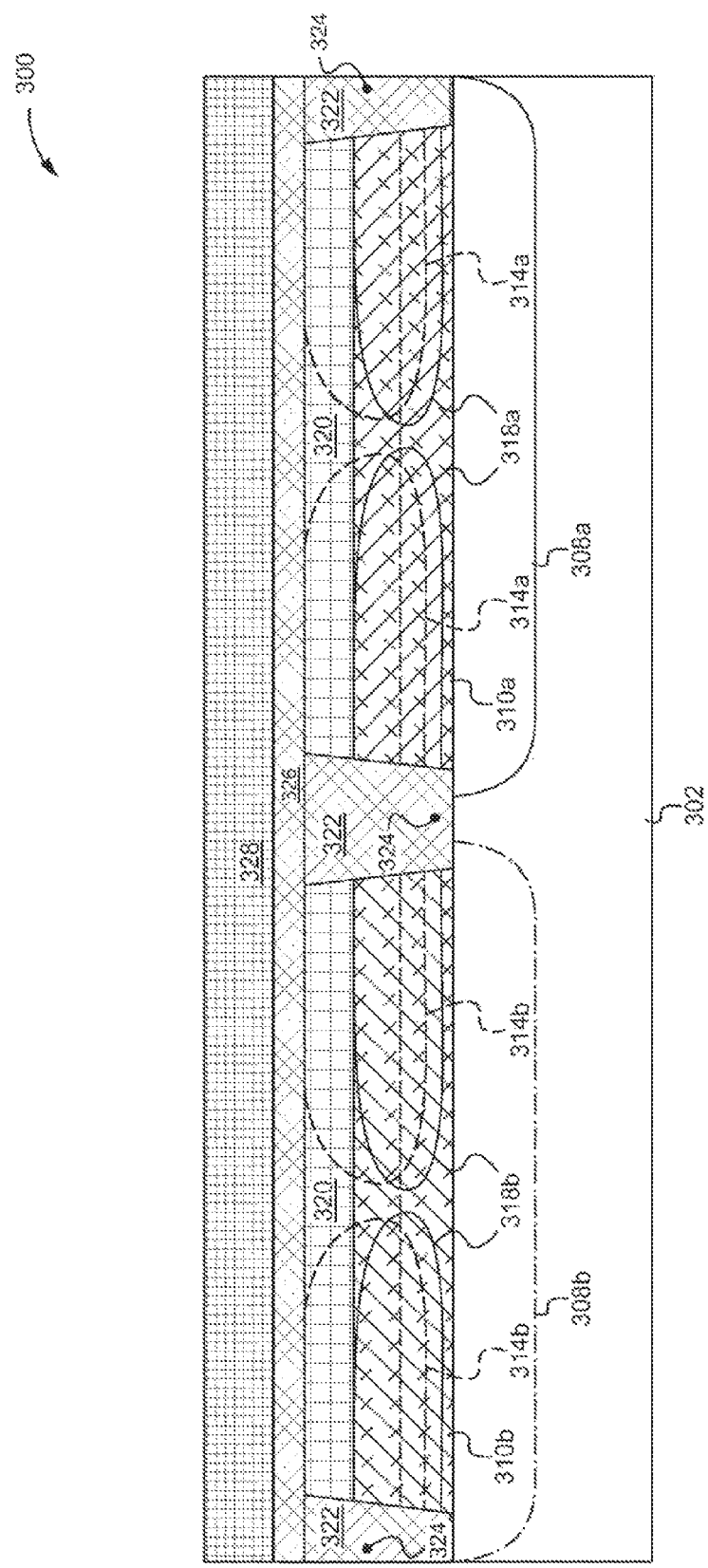
FIGS. 3L and 3M illustrate a process of forming a gate for each well according to some embodiments.
Figure 3M:
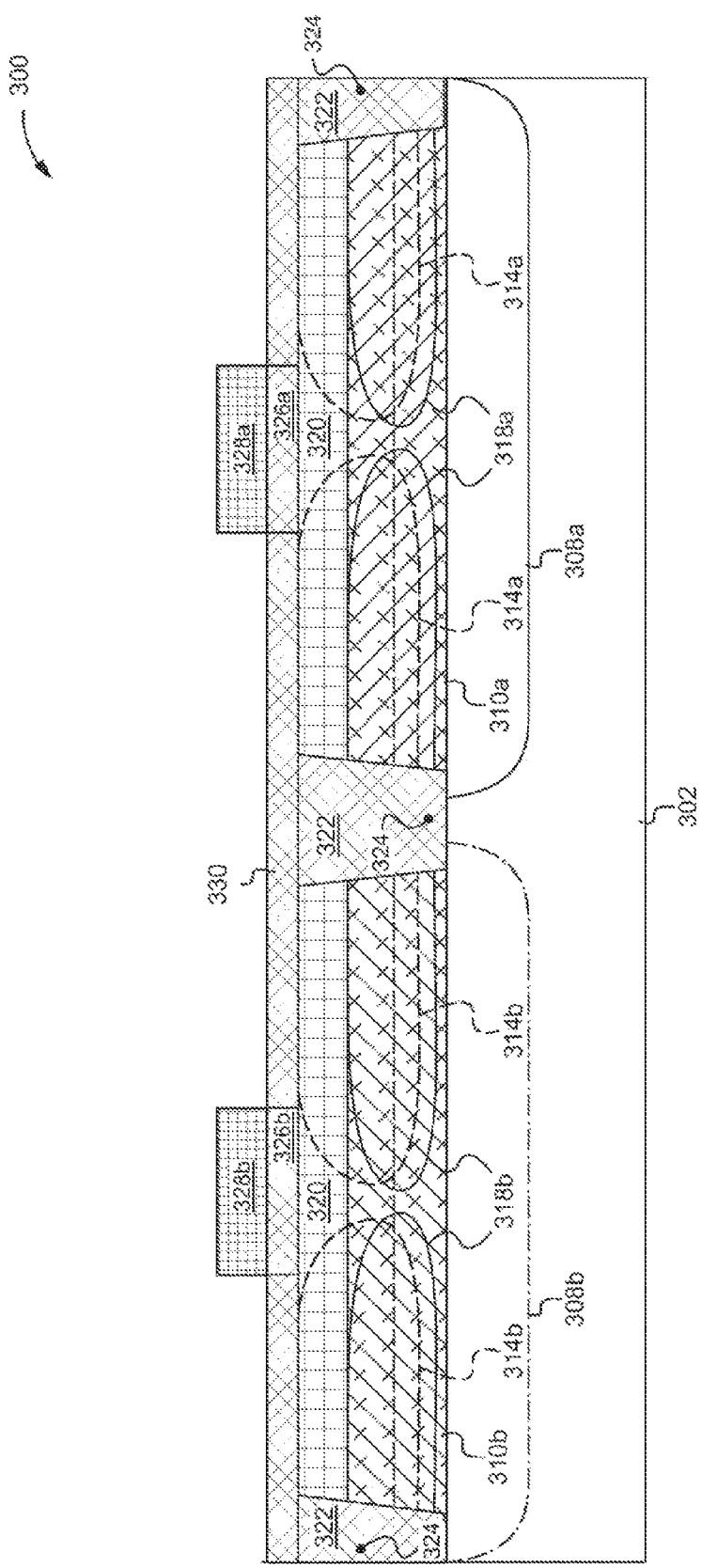
Figure 3N:
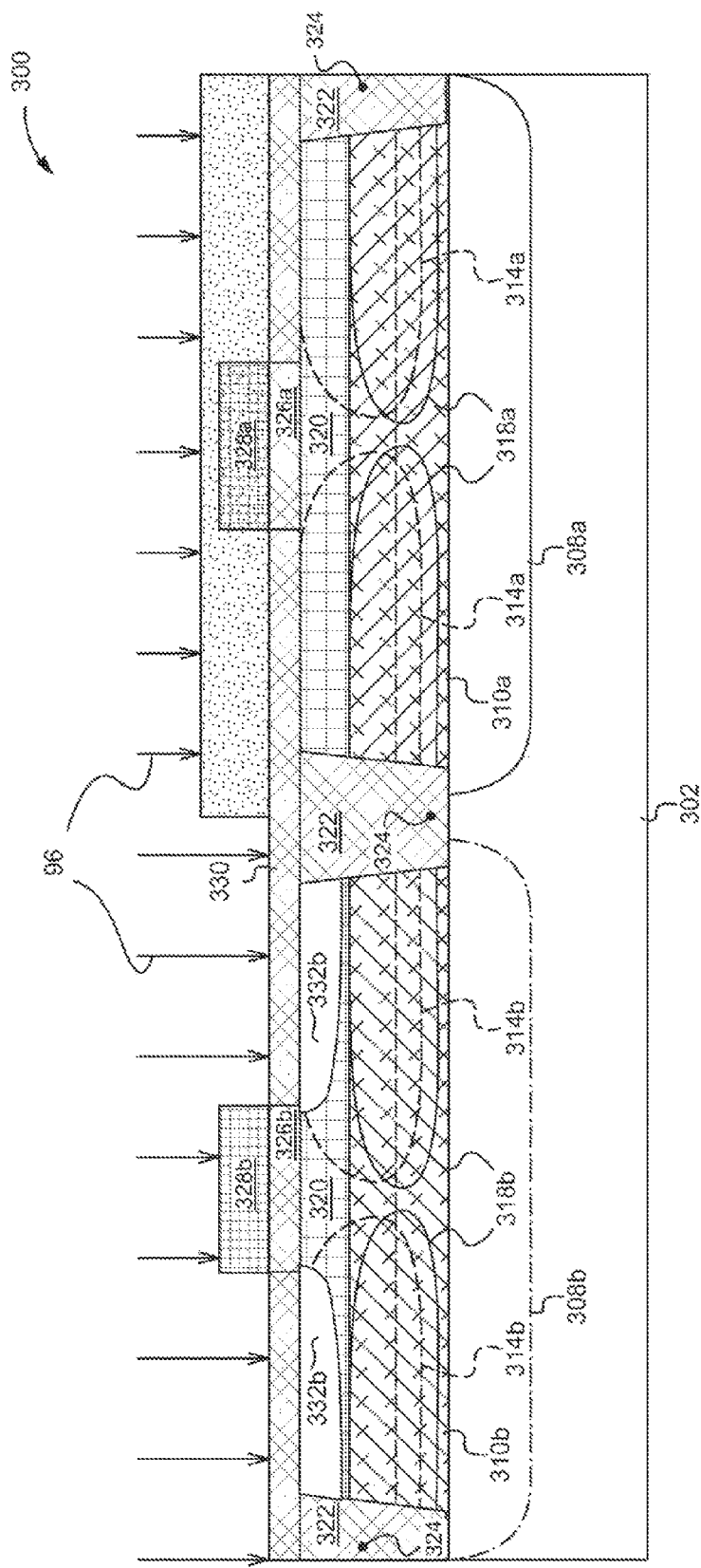
Figure 30:
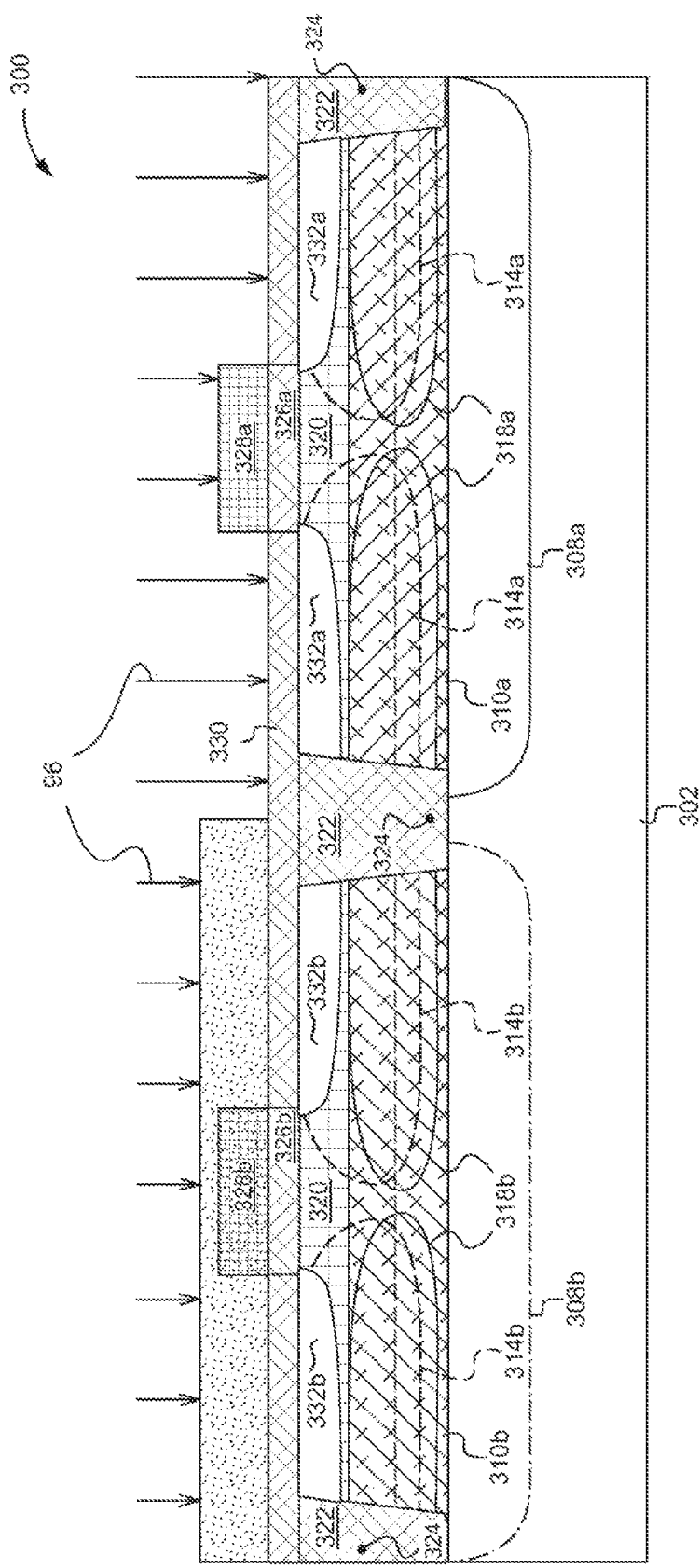
Figure 3P:
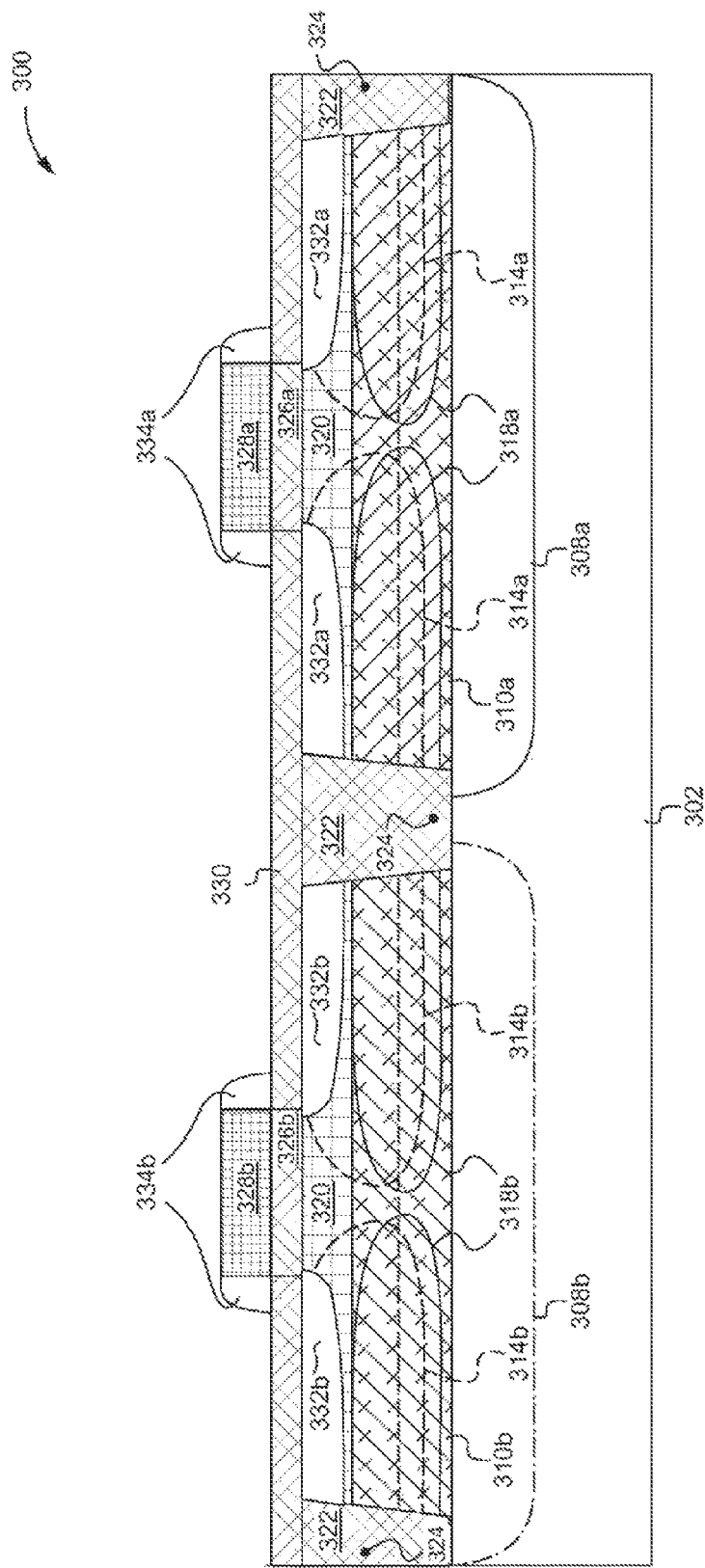
FIG. 3P illustrates the formation of deep source drain (DSD) spacers according to some embodiments.
Figure 3Q:
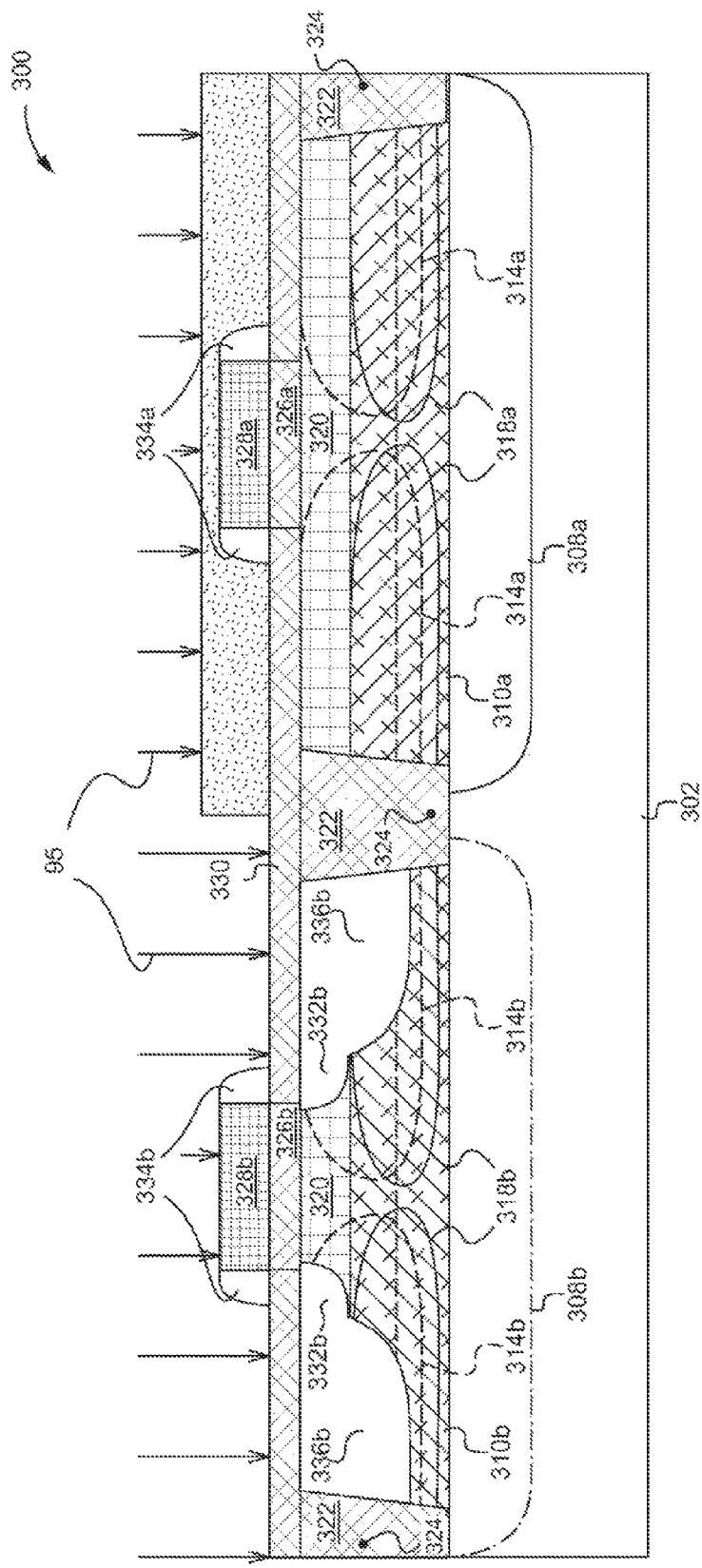
FIGS. 3Q and 3R illustrate a DSD implant process according to some embodiments.
Figure 3R:
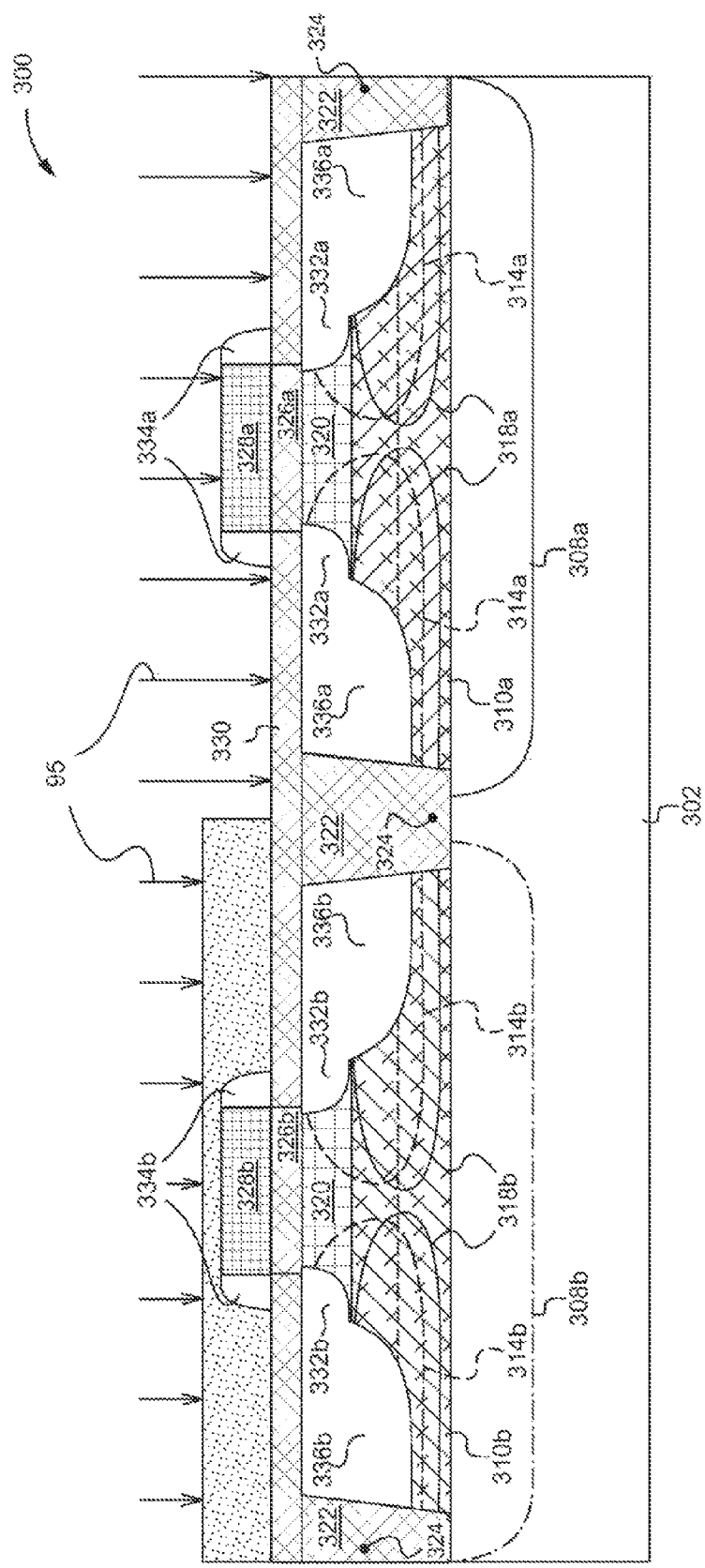
Figure 3S:
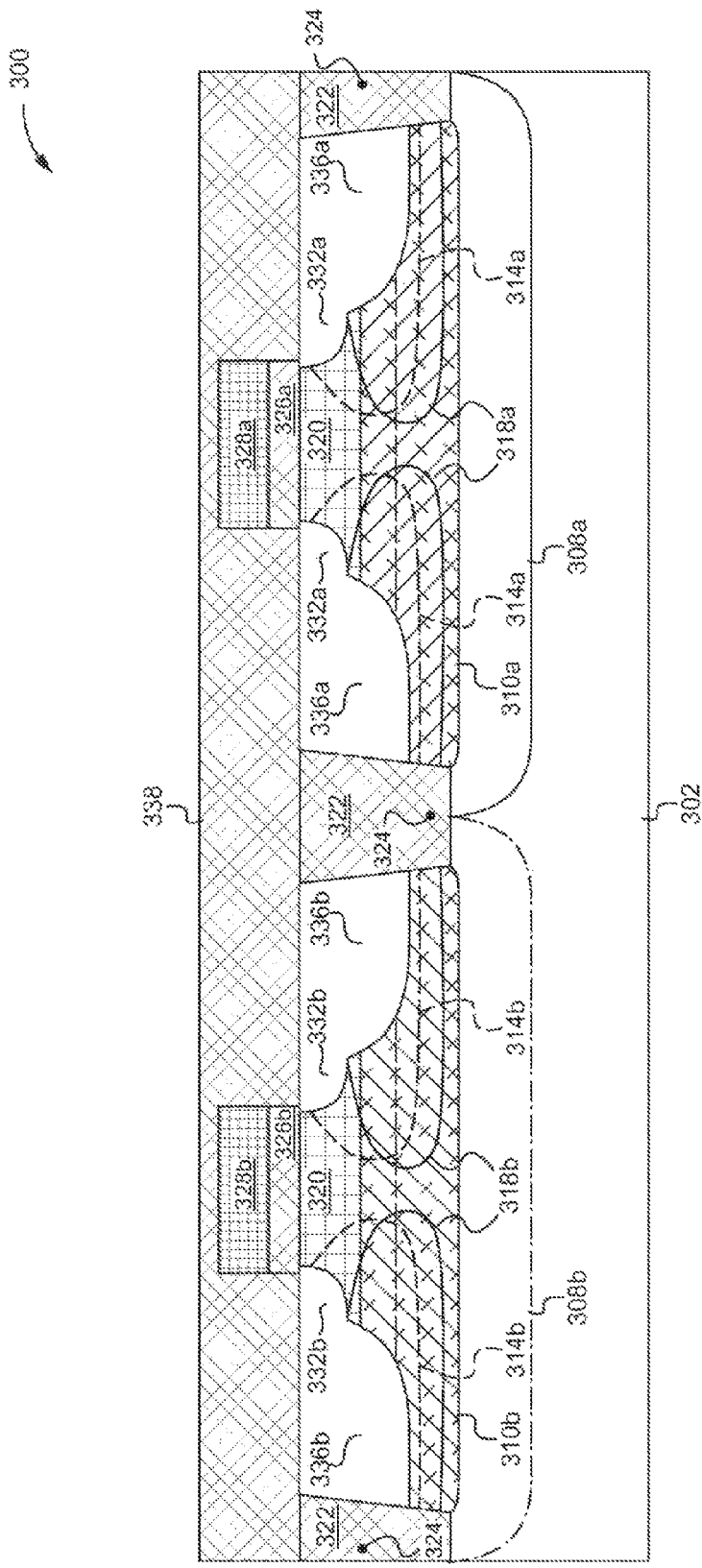
FIG. 3S illustrates the complimentary transistor structure after a thermal treatment process according to some embodiments.
Figure 3T:
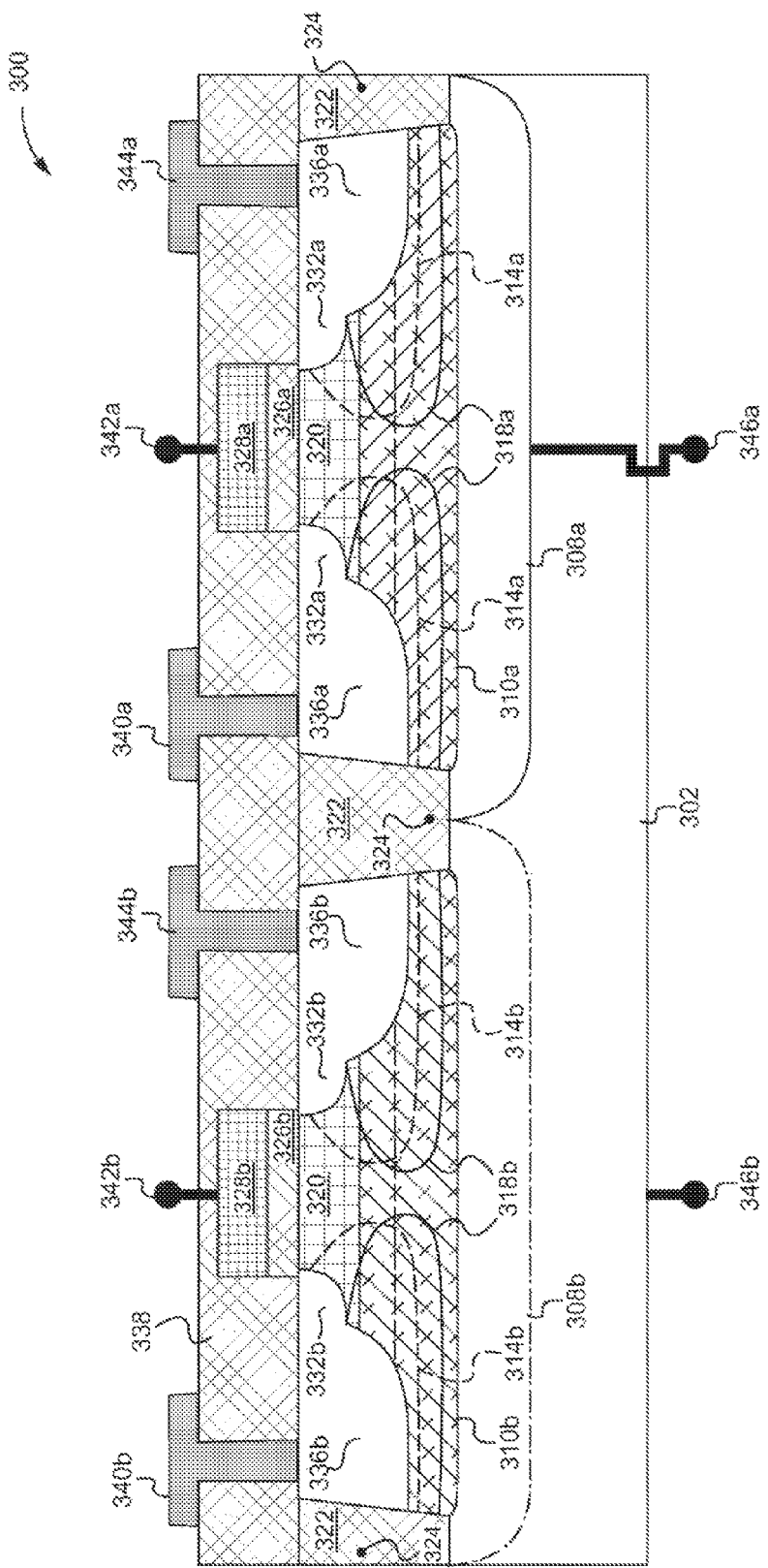
FIG. 3T illustrates the complimentary transistor structure after addition of one or more terminals according to some embodiments.

FIGS. 3A-3T illustrate a cross-sectional view fabrication process 300 of forming a complimentary transistor structure 200 according to some embodiments. It is understood that although the process 300 described with reference to FIGS. 3A-3T relates to forming an re-channel transistor and a p-channel transistor on a p-type substrate 302, other combinations of transistors and substrate types are contemplated and are able to be formed by adjusting the polarities of components within the process. Additionally, as described herein the n-type dopants of a typical processing step of the structure 200 are processed before the p-type dopants as the n-type impurities generally exhibits less diffusivity. Alternatively, one or more of the p-type dopants of any processing step are able to be processed before one or more of the n-type dopants. As shown in FIG. 3A, initially an initial oxide film 304 is grown on a p-type substrate 302. In some embodiments, the substrate 302 is silicon having a doping concentration of $1\times10^{15}$ atoms/cm$^3$. Alternatively, the substrate 302 is able to comprise other p or n-type substrates and/or other doping concentrations as are well known in the art. In some embodiments, the initial oxide film 304 has a thickness between 5-20 nm, for example 10 nm. Alternatively, other thicknesses/ranges of thicknesses are able to be used.

FIGS. 3B and 3C illustrate the well and threshold voltage adjust layer implant process according to some embodiments. As shown in FIG. 3B, photoresist 306 is deposited on the oxide 304 and an n-well mask is created using photolithography and etching away unwanted portions of the photoresist 306. In some embodiments, the photoresist 306 has a thickness of 100 nm. Once the mask is in place, an n-well 308a is implanted followed by implanting an n-type dopant for a p-channel device Vth adjust layer 310a via an impurity implant operation 99. The process is then repeated as shown in FIG. 3C (after removing the n-well mask) wherein a p-mask is created and a p-well 308b and p-type dopant implant for n-channel device Vth adjust layer 310b is implanted via the implant operation 99. Alternatively, the order is able to be reversed and FIG. 3C is performed before FIG. 3B.

In some embodiments, the n-well 308a and p-well 308b implants comprise implanting phosphorus (Ph) or Boron (B) into the substrate 302 forming peak implant concentration between $1\times10^{17}$ atoms/cm$^3$ and $1\times10^{19}$ atoms/cm$^3$, for example, $1\times10^{18}$ atoms/cm$^3$. In some embodiments, the energy used to implant the impurities into the substrate 302 for the n-well 308a and the p-well 308b is between 50 KeV (kiloelectron volts) and 500 KeV, for example, 100 KeV. In some embodiments, the n-type Vth adjust layer 310a implant process comprises implanting arsenic (As) or phosphorus into the substrate 302 forming peak implant concentration between $1\times10^{17}$ atoms/cm$^3$ and $1\times10^{18}$ atoms/cm$^3$, for example, $5\times10^{17}$ atoms/cm$^3$. In some embodiments, the energy used to implant the impurities into the substrate 302 for the n-type Vth adjust layer 310a is between 5 KeV and 20 KeV, for example, 10 KeV. In some embodiments, the p-type Vth adjust layer 310b implant process comprises implanting boron or boron difluoride (BF2) into the substrate 302 forming peak implant concentration between $1\times10^{17}$ atoms/cm$^3$ and $1\times10^{18}$ atoms/cm$^3$, for example, $5\times10^{17}$ atoms/cm$^3$. In some embodiments, the energy used to implant the impurities into the substrate 302 for the p-type voltage adjust layer 310b is between 5 KeV and 20 KeV, for example, 10 KeV. Alternatively, other numbers of dopants, peak implant concentrations, implant energies and/or types of dopants are able to be used as described above. In particular, it is understood that the concentration and/or strength of the threshold adjust layer implant is able to be varied based on a desired threshold voltage.

FIGS. 3D-3F illustrate first or shallow halo implant processing according to some embodiments. As shown in FIG. 3D, the remaining photoresist and oxide from the previous steps is removed (e.g. etching) and a new oxide film is grown with a thickness between 5 and 20 nm and etched (using photolithography) to form a gate oxide element 312a, 312b for each well 308a, 308b positioned substantially where a control gate will subsequently be positioned on the substrate 302. In some embodiments, the etching of the new oxide film is only partial such that the subsequent implanting is through approximately 5 nm thick oxide in the etched areas. In some embodiments, one or more spacer pairs 316a, 316b (see FIG. 3G) are able to be added around one or more of the gate oxide elements 312a, 312b using the same process as described in FIG. 3G. In some embodiments, the spacers are able to be mini-spacers such that they have a width of 10 to 15 Å. Then as shown in FIGS. 3E and 3F, one or more first halo implants 314a, 314b are implanted via a halo implant process 98 wherein photolithography (e.g. photoresist, masks and etching) is used to cover/uncover one or more of the wells 308a, 308b while the others are implanted with first halo implants 314a, 314b. For example, when a first type of impurities with a first polarity is used, only those wells 308 that correspond to the first halo implants having the first polarity are uncovered, whereas when a second type of impurities having a second polarity is used, only the other wells 308 that correspond to the second polarity are uncovered. In some embodiments, the halo implant process 98 comprises implanting at a tilt or angle. As described above, the first halo implants 314a, 314b are implanted to assist in suppressing the leakage currents that are a result of short channel effect (SCE). In particular, the positioning of the halo implants 314a, 314b within the transistor at a depth that is apart from the surface of the substrate 302 avoids creating high level concentrations (of the same polarity as the channel region) just below the gate in the channel region, which can lead to increased threshold voltages and increased channel resistance. In some embodiments, as described above the halo implants 314a, 314b are able to have a low impurity concentration region and a peak purity concentration region. It is understood that the order is able to be reversed and FIG. 3F is performed before FIG. 3E.

In some embodiments, implanting the first halo implants 314a for n-well 308a comprises implanting arsenic, phosphorus or antimony into the substrate 302 forming peak implant concentration between $1 \times 10^{18}$ atoms/cm$^3$ and $1 \times 10^{19}$ atoms/cm$^3$, for example, $5 \times 10^{18}$ atoms/cm$^3$. In some embodiments, the energy used to implant the impurities into the substrate 302 for the first halo implants 314a is between 2 KeV and 10 KeV, for example, 5 KeV. In some embodiments, implanting the first halo implants 314b for p-well 308b comprises implanting BF2 or boron into the substrate 302 forming peak implant concentration between $1 \times 10^{18}$ atoms/cm$^3$ and $1 \times 10^{19}$ atoms/cm$^3$, for example, $5 \times 10^{18}$ atoms/cm$^3$. In some embodiments, the energy used to implant the impurities into the substrate 302 for the first halo implants 314b is between 2 KeV and 10 KeV, for example, 5 KeV. Alternatively, other numbers of dopants, peak implant concentrations, implant energies and/or types of dopants are able to be used as described above.

FIGS. 3G-3I illustrate second or deep halo implant processing according to some embodiments. As shown in FIG. 3G, the remaining photoresist from the previous steps is removed (e.g. etching) and a spacer oxide film is grown with a thickness between 50 and 200 nm (e.g. 100 nm) and etched (using photolithography) to form spacer pairs 316a, 316b for each gate oxide element 312a, 312b positioned such that the pairs 316a, 316b straddle each of the gate oxide elements 312a, 312b. As shown in FIG. 3G, the spacer pairs 316a, 316b are made of oxide. Alternatively, one or more of the spacer pairs 316a, 316b are able to be made of other materials, such as silicon nitride and/or a combination of oxide and silicon nitride. In some embodiments, each of the spacer pairs 316a, 316b have a width ranging from zero nm (when no spacer is used) to 20 nm, or from 2 nm to 10 nm, for example 5 nm. In some embodiments, the spacer pairs 316a, 316b are able to be mini-spacers and have a width of 10 to 15 Å. In particular, the spacer pairs 316a, 316b are able to be positioned such that the second halo implants 318a, 318b, discussed below, are able to be formed at an offset below the first halo implants 314a, 314b. In some embodiments where spacer pairs were created for the first halo implants 314a, 314b, the same spacer pairs are able to be used for implanting the second halo implants 318a, 318b. Alternatively, both the first and second halo implants are able to be implanted without the use of spacer pairs.

Then as shown in FIGS. 3H and 3I, one or more second halo implants 318a, 318b are implanted via a halo implant process 97 wherein photolithography (e.g. photoresist, masks, etching) is used to cover/uncover one or more of the wells 308a, 308b while the others are implanted with the second halo implants 318a, 318b. For example, when a first type of impurities with a first polarity is used, only those wells 308 that correspond to the second halo implants having the first polarity are uncovered, whereas when a second type of impurities having a second polarity is used, only the other wells 308 that correspond to the second polarity are uncovered. The second halo implants 318a, 318b are able to be positioned deeper within the substrate 302 below the first halo implants 314a, 314b. In some embodiments, the halo implant process 97 comprises implanting at a tilt or angle. As with the first halo implants 314a, 314b, the impurities used to form the second halo implants 318a, 318b are of the same polarity as the substrate channel to which they correspond. In some embodiments, the peak concentration of second halo implants 318a, 318b are positioned just below the DSD junctions 336a, 336b as described below in reference to FIGS. 3Q and 3R. As described above, the second halo implants 318a, 318b are implanted to further reduce the leakage from the deeper channel region where the gate bias cannot control the potential. In some embodiments, as described above the halo implants 318a, 318b are able to have a low impurity concentration region and a peak impurity concentration region.

In some embodiments, implanting the second halo implants 318a, 318b for the n-well 308a and the p-well 308b comprises implanting arsenic, phosphorus or antimony for the implants 318a or implanting boron or BF2 for implants 318b into the substrate 302 forming peak implant concentration between $1 \times 10^{18}$ atoms/cm$^3$ and $1 \times 10^{19}$ atoms/cm$^3$, for example, $5 \times 10^{18}$ atoms/cm$^3$. In some embodiments, the energy used to implant the impurities into the substrate 302 for the second halo implants 318a and 318b is between 5 KeV and 20 KeV, for example, 10 KeV. Alternatively, other numbers of dopants, peak implant concentrations, implant energies and/or types of dopants are able to be used as described above. It is understood that the order is able to be reversed and FIG. 3I is performed before FIG. 3H.

FIG. 3J illustrates a process of forming an epitaxial layer 320 on the substrate 302 according to some embodiments. As shown in FIG. 3J, the spacer pairs 316a, 316b, gate oxide elements 312a, 312b and residual photoresist or other oxide are removed (e.g. via etching) and the epitaxial layer 320 is formed over or deposited on top of the substrate 302 and to eventually be used as a channel region. Because the epitaxial layer 320 is deposited on top of the substrate 302 after the substrate 302 has been doped to form the wells 308a, 308b, the Vth adjust layers 310a, 310b, and the halos 314a, 314b, 318a, 318b. Accordingly, the wells 308a, 308b, the Vth adjust layers 310a, 310b and the halos 314a, 314b, 318a, 318b are buried under the epitaxial layer 320. The portion of the epitaxial layer 320 that forms the channel region, as described below, is then able to be covered by the gate electrodes 328a, 328b and/or gate oxides 326a, 326b during implanting of the DSDs 336a, 336b and SDEs 332a, 332b. As a result, the epitaxial layer 320 provides the benefit of reducing the process variability of the transistor structure 200 particularly in the channel region. In some embodiments, the epitaxial layer 320 has a thickness between 2 and 30 nm, for example 20 nm. Alternatively, greater or smaller thicknesses are contemplated. In some embodiments, the epitaxial layer 320 is un-doped. Alternatively, the layer 320 is able to be lightly doped. Further, it is noted that dopants from the first and second halo implants and the Vth adjust implants are able to updiffuse into the epitaxial layer 320.

FIG. 3K illustrates deposition and etching processes of insulating or separating the active areas of the substrate 302 according to some embodiments. As shown in FIG. 3K, using a trench mask a shallow trench 322 is etched or otherwise dug into the substrate 302 between at least a portion of the p-well 308b and the n-well 308a. In some embodiments, the trench 322 has a depth in the range of 200 to 600 nm, for example 400 nm. Alternatively, other depths are contemplated. The trench 322 is then filled and the remainder of the substrate 302 is covered with a trench oxide 324 which is then partially removed (not shown) in active areas to expose the epitaxial layer 320 areas and other active areas that correspond to the p-well 308b and the n-well 308a. In some embodiments, the removal of the excess trench oxide 324 is performed via chemical mechanical polishing planarization process. Alternatively, other removal methods are able to be used such as etching. In some embodiments, oxide is deposited before the trench 322 is dug, wherein additional oxide is then deposited to fill the trench as the trench oxide 324. Alternatively, other types of isolation are able to be used such as diffusion isolation or other techniques well known in the art.

FIGS. 3L and 3M illustrate a process of forming a gate 326a, 326b for each well 308 according to some embodiments. As shown in FIG. 3L, a gate oxide layer 326 is grown on the surface of the substrate 302 including the exposed surface of the active areas and a gate electrode layer 328 is formed over the oxide layer 326. In some embodiments, the oxide layer 326 has an effective thickness of 1 nm and is made of silicon dioxide. Alternatively, the layer 326 is able to have other thicknesses and/or be made of other materials such as materials that are high-k dielectrics or combination of silicon dioxide and/or high-K dielectric materials. In some embodiments, the electrode layer 328 is made of degenerately doped (more than $5 \times 10^{19}$ atoms/cm$^3$) polysilicon. In some embodiments, the polarity of the polysilicon for NMOS is n+ poly and for PMOS is p+ poly. Alternatively, the electrode layer 328 is able to be made of one or more metals, polymers or other electrode materials. As shown in FIG. 3M, using photolithography and a gate mask, the electrode layer 328 and the gate oxide layer 326 are etched into separate gate electrodes 328a, 328b and separate gate oxides 326a, 326b for each well 308. In particular, the gate electrodes 328a, 328b and gate oxides 326a, 326b are able to be positioned on the substrate in substantially the same location as the gate oxide elements 312a, 312b described above. Further as shown in FIG. 3M, a masking oxide layer 330 is deposited and etched on the substrate 302 optionally forming SDE mini-spacers (not shown).

FIGS. 3N and 3O illustrate an SDE implant process according to some embodiments. As shown in FIGS. 3N and 3O, one or more SDEs 332a, 332b are implanted via an extension implant process 96 wherein photolithography is used to selectively cover/uncover one well of the wells 308a, 308b while the other is implanted with the one or more SDE extensions 332a, 332b. For example, when a first type of impurities with a first polarity is used, only those wells 308 that correspond to the SDE having the first polarity are uncovered, whereas when a second type of impurities having a second polarity is used, only the other wells 308 that correspond to the second polarity are uncovered. It is noted that the polarity of the one or more SDE extensions 332a, 332b is opposite to that of the channel/well region, which is in contrast the polarity of the halo implants 314, 318 which are the same as the well doping type 308. In some embodiments, implanting the one or more SDEs 332a, 332b comprises forming a pair of mini-spacers pairs (not shown) for each a gate electrode 328a, 328b positioned such that the pairs straddle each of the gate electrode 328a, 328b. The pairs of mini-spacers are able to be made of oxide and/or other materials, such as silicon nitride. In some embodiments, each of the mini-spacers have a width of 10 to 15 Å. Alternatively, other widths are able to be used.

In some embodiments, implanting the one or more SDEs 332a, 332b for the n-well 308a and the p-well 308b comprises implanting boron or BF2 for the extensions 332a or implanting arsenic, phosphorus or antimony for extensions 332b into the substrate 302 forming peak implant concentration between $5 \times 10^{19}$ atoms/cm$^3$ and $5 \times 10^{20}$ atoms/cm$^3$. In some embodiments, the energy used to implant the impurities into the substrate 302 for the one or more SDEs 332a, 332b is between 200 eV and 1000 eV, for example, 300 eV. Alternatively, other numbers of dopants, peak implant concentrations, implant energies and/or types of dopants are able to be used as described above. It is understood that the order is able to be reversed and FIG. 3O is performed before FIG. 3N. After the one or more SDE extensions 332a, 332b are implanted, an etch operation (not shown) is performed to clean any residue left from the operation 96.

It should also be noted that an alternative way of creating the one or more SDEs 332a, 332b is with solid source deposition. Solid source deposition is done by doping the transistor with the impurities used to form the one or more SDEs 332a, 332b. After the transistor is doped, an annealing operation is performed which causes the impurities to diffuse through the substrate 302.

FIG. 3P illustrates the formation of DSD spacers 334a, 334b according to some embodiments. As shown in FIG. 3P, a DSD spacer oxide film is grown with a thickness between 50 and 200 nm (e.g. 100 nm) and etched (using photolithography) to form DSD spacer pairs 334a, 334b for each gate electrode 328a, 328b positioned such that the pairs 334a, 334b straddle each of the gate electrode 328a, 328b. As shown in FIG. 3P, the DSD spacer pairs 334a, 334b are made of oxide. Alternatively, one or more of the DSD spacer pairs 334a, 334b are able to be made of other materials, such as silicon nitride and/or a combination of oxide and nitride. In some embodiments, each of the DSD spacer pairs 334a, 334b have a width ranging from 30 nm to 100 nm, for example, 50 nm. In particular, the DSD spacer pairs 334a, 334b are able to be positioned such that the DSDs 336a, 336b, discussed below, are able to be formed at an offset from the SDE extensions 332a, 332b.

FIGS. 3Q and 3R illustrate a DSD implant process according to some embodiments. As shown in FIGS. 3Q and 3R, one or more DSDs 336a, 336b are implanted via an extension implant process 95 wherein photolithography is used to selectively cover/uncover one well of the wells 308a, 308b while the other is implanted with the DSDs 336a, 336b. For example, when a first type of impurities with a first polarity is used, only those wells 308 that correspond to the DSD having the first polarity are uncovered, whereas when a second type of impurities having a second polarity is used, only the other wells 308 that correspond to the second polarity are uncovered. It is noted that the polarity of the DSDs 336a, 336b is opposite to that of the channel/well region, which is in contrast to the polarity of the halo implants 314, 318 which are the same as the well doping type 308.

In some embodiments, implanting the DSDs 336a for the n-well 308a comprises implanting boron or BF2 into the substrate 302 forming peak implant concentration between $5 \times 10^{19}$ atoms/cm$^3$ and $2 \times 10^{20}$ atoms/cm$^3$. In some embodiments, implanting the DSDs 336b for the p-well 308b comprises implanting arsenic, phosphorus or antimony into the substrate 302 forming peak implant concentration between $1 \times 10^{20}$ atoms/cm$^3$ and $5 \times 10^{20}$ atoms/cm$^3$. In some embodiments, the energy used to implant the impurities into the substrate 302 for the DSDs 336a, 336b is between 500 eV and 5 KeV, for example, 1 KeV. Alternatively, other numbers of dopants, peak implant concentrations, implant energies and/or types of dopants are able to be used as described above. It is understood that the order is able to be reversed and FIG. 3R is performed before FIG. 3Q. After the DSDs 336a, 336b are implanted, an etch operation (not shown) is performed to clean any residue left from the operation 95 including any remaining photoresist and the DSD spacer pairs 334a, 334b. Additionally, it should be noted that the impurities will diffuse through the substrate 302 to form the optimized source-drain wells that extend below the deep or second halo implants 318a, 318b after an annealing operation described below.

FIG. 3S illustrates the complimentary transistor structure 300 after a thermal treatment process according to some embodiments. As shown in FIG. 3S, an anneal oxide 338 is deposited over the substrate 302 including the gate electrode 328a, 328b and corresponding gate oxide elements 326a, 326b. The structure 300 is then subjected to the thermal treatment process. In some embodiments, the thermal treatment process is a rapid thermal anneal (RTA) process. Alternatively, the thermal treatment process is able to be a laser thermal anneal (LTA) process, a millisecond anneal and/or other types of anneal processes. In some embodiments, the thermal treatment process is done at a temperature ranging from 900.degree. C. to 1100.degree. C., for example, 950.degree. C. In some embodiments, the time for the thermal treatment process ranges from 5 seconds to 60 seconds, for example, 10 seconds. After the thermal treatment operation is completed, the DSDs 336a, 336b are defined. For example, the thermal treatment is able to cause the DSDs 336a, 336b to extend from the surface of the substrate 302 down to near the deep halo implants 318a, 318b. As a result, when one or more of the gate electrodes 328a, 328b are turned ON with lower threshold voltages (due to the Vth adjust layers 310a, 310b), an inversion layer is able to be formed and current is able to flow from one DSDs 336a, 336b to another DSDs 336a, 336b on the other side of the gate electrodes 328a, 328b with reduced resistance. In particular, in some embodiments the threshold voltage is able to be approximately 0.35V and the device is able to be turned ON due to an applied gate voltage of approximately 0.9V.

FIG. 3T illustrates the complimentary transistor structure 300 after addition of one or more terminals according to some embodiments. As shown in FIG. 3T, source terminals 340a, 340b, gate terminals 342a, 342b, drain terminals 344a, 344b and body terminals 346a, 346b are added to the transistor structure 300 thereby forming two transistors on the single substrate 302 capable of operating complementarity or separately. In particular, each of the transistors comprise a plurality of halo implants, a Vth adjust implant/layer and/or an epitaxial layer that minimize leakage current, punch through, high ON resistance and threshold voltage variation due to process variability, while at the same time maintaining required threshold voltages despite the use of small gate dimensions. Specifically, the first or shallow halo implants and the second or deep halo implants along with the Vth adjust implant/layer enable a peak concentration of substrate impurities at a level below the gates 342a, 342b, such that the resistance of the transistor is able to be minimized along with the threshold voltage, threshold voltage fluctuations, short channel effects, and leakage current in the transistor. It is understood that the process of FIGS. 3A-3T is able to further comprise one or more etching or other types of cleaning operations to clean the surface after one or more of the steps, wherein these operations have not been described herein for the sake of brevity. Further it is understood that one or more of the steps described relating to FIGS. 3A-3T are able to be omitted and/or performed in a different order such that FIGS. 3A-3T are not necessarily sequential.

Figure 4:
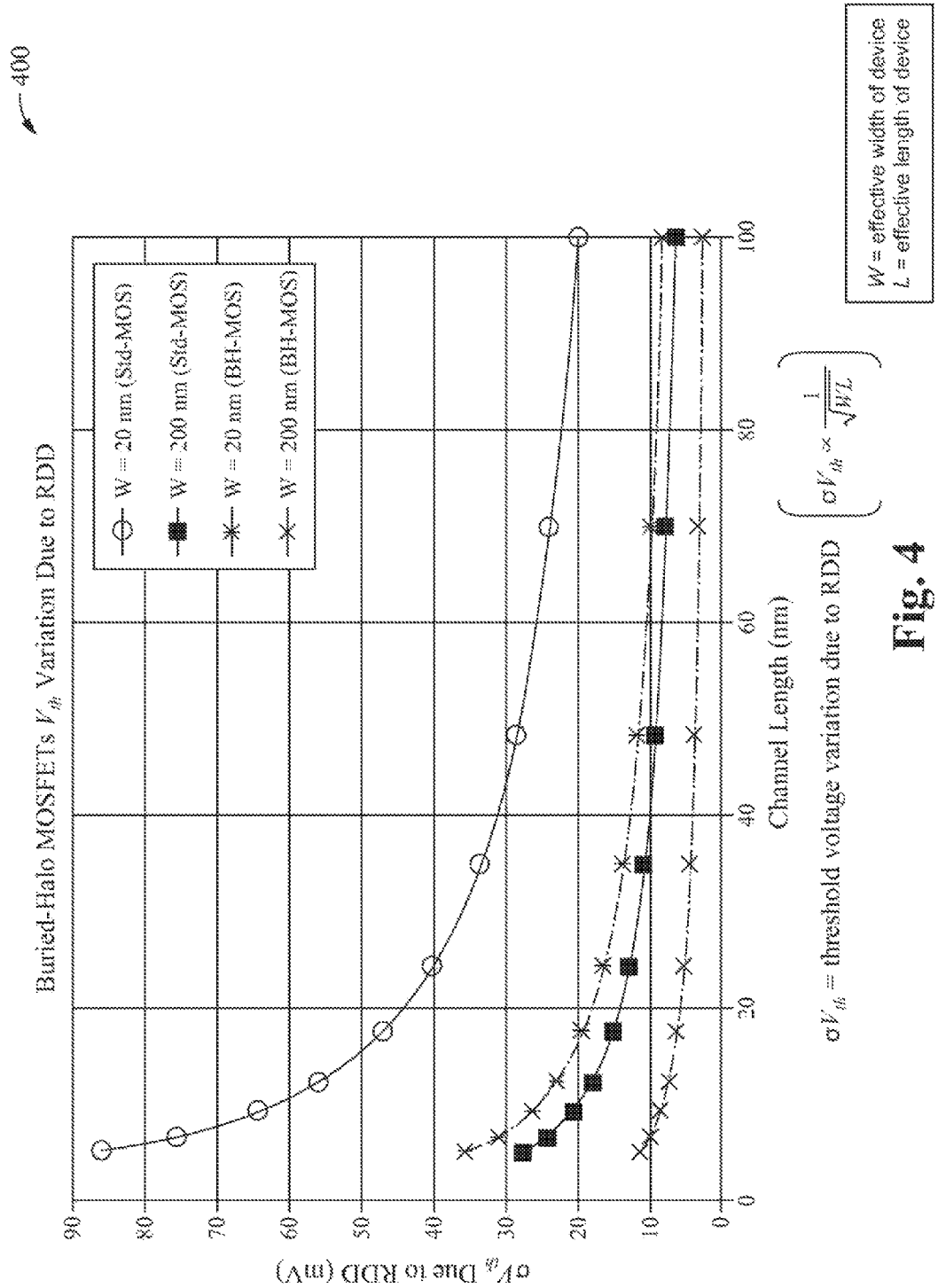
FIG. 4 illustrates a graph 400 illustrating threshold voltage variation in buried-halo MOSFETs due to random discrete dopants (RDD) versus channel length according to some embodiments.

FIG. 4 illustrates a graph 400 illustrating threshold voltage variation in buried-halo MOSFETs due to random discrete dopants (RDD) versus channel length according to some embodiments. As shown in FIG. 4, in conventional or standard (std) MOSFETs as the channel length decreases, the threshold voltage variation caused by the RDD increases greatly exceeding 80 mV and 20 mV in standard MOSFETs having effective channel widths of 20 nm and 200 nm, respectively, for channel lengths below 20 nm. In contrast, in BH-MOSFETs having a structure as described above in FIGS. 1-3, the increase in threshold voltage variation is substantially reduced such than even with a channel length below 20 nm the threshold voltage variation is less than 40 mV and 20 mV for BH-MOSFETs having an effective channel width of 20 and 200 nm, respectively. As described herein, this reduction in the BH-MOSFETs described herein is due to the combination of an epitaxial layer deposited on top of one or more buried halos such that the RDD effects are minimized within the channels.

The embodiments of the transistor structures described herein provide the advantage of an epitaxial layer deposited on top of the doped substrate such that process variability (e.g. random dopant fluctuation) is reduced. Further, the structures provide the advantage of enabling an optimized source-drain structure that is formed to enable the manufacturing of transistor devices having gate lengths below 22 nm. Further, the deep halo implants are able to further reduce the leakage from the deeper channel region where the gate bias cannot control the potential. In particular, the shallow and deep halo implants are able to allow a peak concentration of substrate impurities at a level below the gate, such that a resistance of the transistor is able to be minimized along with the threshold voltage, threshold voltage fluctuations, short channel effects, and leakage current in the transistor. In other words, the optimized source-drain regions should also enable the manufacture of even shorter gate lengths while minimizing the likelihood of leakage currents, punch through, and excessive channel resistance. Further, these benefits are able to be equally applied to complementary transistors (e.g., CMOS).

The present application has been described in terms of specific embodiments incorporating details to facilitate the understanding of the principles of construction and operation of the transistor having multiple halo implants. It is understood that the halo implants described herein are able to be the addition of very thin heavily doped regions of the same doping type as the body/substrate positioned tight against the junction walls to limit the extent of depletion regions. The halo implants along with the Vth adjust implant/layer form a super-steep retrograde (SSR) channel doping profile with peak concentration below the surface of the channel region. Further, many of the components shown and described in the various figures can be interchanged to achieve the results necessary, and this description should be read to encompass such interchange as well. Additionally, concentrations, doses, materials, dopants, and dimensions described herein are provided by way of example only, and should not be construed as limiting. Such values can vary according to device application and/or dimension. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:
1. A method of forming a transistor, comprising:
   forming a gate mask on a substrate having a vertical location aligned with that of a transistor control gate;
   implanting first conductivity type dopants with the gate mask as an implant mask to form a first shallow halo region;

implanting first conductivity type dopants with at least the gate mask as an implant mask to form a first deep halo region having a peak dopant concentration profile at a greater substrate depth than the first shallow halo region;

forming an epitaxial layer on top of the substrate;

forming a first control gate structure on the epitaxial layer;

forming a first source or drain region, of a second conductivity type, in at least the epitaxial layer to a side of the first control gate, and over the first shallow halo region and the first deep halo region; and annealing to diffuse dopants into the epitaxial layer from at least the first shallow halo region.

2. The method of claim 1, further comprising forming a first well of the first conductivity type in the substrate, wherein the gate mask is formed over the first well.

3. The method of claim 1, further comprising, prior to forming the first deep halo region, forming one or more spacers on the gate mask.

4. The method of claim 1, further comprising patterning the epitaxial layer and the substrate to form active areas.

5. The method of claim 4, further comprising separating the substrate and the epitaxial layer in at least a lateral direction with one or more electrically isolating structures to form the active areas, the lateral direction being parallel to a substrate surface.

6. The method of claim 1, wherein forming the first control gate structure on the epitaxial layer comprises
forming a gate insulator on a surface of the epitaxial layer,
forming a gate electrode material on the gate insulator, and
patterning the gate insulator and the gate electrode material to form the first control gate structure.

7. The method of claim 1, wherein forming the first source or drain region comprises implanting dopants of the second conductivity type with at least the control gate structure as an implant mask.

8. The method of claim 7, further comprises prior to forming the first source or drain region, forming spacers on sides of the control gate structure, wherein the spacers form another portion of the implant mask.

9. The method of claim 1, further comprises annealing to diffuse dopants into the epitaxial layer from at least the first deep halo region.

10. A method of forming a transistor, comprising:
forming a gate mask on a substrate having a vertical location aligned with that of a transistor control gate;
implanting first conductivity type dopants with the gate mask as an implant mask to form a first shallow halo region;
implanting first conductivity type dopants with at least the gate mask as an implant mask to form a first deep halo region having a peak dopant concentration profile at a greater substrate depth than the first shallow halo region;
forming an epitaxial layer on top of the substrate;
forming a first control gate structure on the epitaxial layer;
forming a first source or drain region, of a second conductivity type, in at least the epitaxial layer to a side of the first control gate, and over the first shallow halo region and the first deep halo region;
forming a second well of the second conductivity type in the substrate;
forming a second gate mask over the second well;
implanting dopants of the second conductivity type with the second gate mask as an implant mask to form a second shallow halo region;
implanting dopants of the second conductivity type with at least the second gate mask as an implant mask to form a second deep halo region having a peak dopant concentration profile at a greater substrate depth than the second shallow halo region;
forming a second control gate structure on the epitaxial layer above the second well; and
forming a second source or drain region, of the first conductivity type, in at least the epitaxial layer to a side of the second control gate, and over the second shallow halo region and the second deep halo region.

11. A method of forming a transistor, comprising:
forming a gate mask on a substrate having a vertical location aligned with that of a transistor control gate;
implanting first conductivity type dopants with the gate mask as an implant mask to form a first shallow halo region;
implanting first conductivity type dopants with at least the gate mask as an implant mask to form a first deep halo region having a peak dopant concentration profile at a greater substrate depth than the first shallow halo region;
forming an epitaxial layer on top of the substrate;
forming a first control gate structure on the epitaxial layer;
forming a first source or drain region, of a second conductivity type, in at least the epitaxial layer to a side of the first control gate, and over the first shallow halo region and the first deep halo region; and
prior to forming the first shallow halo region, forming a threshold voltage adjust region having a peak dopant concentration profile at a depth greater than that of the first shallow halo region and shallower than that of the first deep halo region.

12. The method of claim 11, further comprises annealing to diffuse dopants into the epitaxial layer from at least the threshold voltage adjust region.

13. The method of claim 11, further including:
prior to forming the first deep halo regions, forming spacer structures that extend the gate mask in a lateral direction, the lateral direction being parallel to a substrate surface.

14. A method, comprising:
forming a gate mask over a well doped to a first conductivity type that is formed in a substrate, the gate mask being at a location for a transistor gate;
forming shallow halo regions by implanting dopants of the first conductivity type with the gate mask as an implant mask;
forming deep halo regions by implanting dopants of the first conductivity type with at least the gate mask as an implant mask, the deep halo regions having a peak dopant concentration profile at a greater substrate depth than the shallow halo regions;
removing the gate mask;
forming an epitaxial layer on a top of the substrate over the well;
forming a gate insulator over the epitaxial layer;
forming a control gate structure over the gate insulator at the location for the transistor gate; and
forming source or drain regions by implanting dopants of a second conductivity type with at least the control gate structure as an implant mask, the source or drain regions being formed in at least the epitaxial layer and to a side of the control gate structure; wherein
the well extends lower into the substrate than the shallow halo regions.

15. The method of claim 14, wherein:

prior to forming the deep halo regions, forming spacer structures that extend the gate mask in a lateral direction, the lateral direction being parallel to a substrate surface.

16. The method of claim 14, wherein:

prior to forming the shallow halo regions, forming spacer structures that extend the gate mask in a lateral direction, the lateral direction being parallel to a substrate surface.

17. A method, comprising:

forming a gate mask over a well doped to a first conductivity type that is formed in a substrate, the gate mask being at a location for a transistor gate;

forming shallow halo regions by implanting dopants of the first conductivity type with the gate mask as an implant mask;

forming deep halo regions by implanting dopants of the first conductivity type with at least the gate mask as an implant mask, the deep halo regions having a peak dopant concentration profile at a greater substrate depth than the shallow halo regions;

removing the gate mask;

forming an epitaxial layer on a top of the substrate over the well;

diffusing at least a portion of the dopants of the shallow halo regions into the epitaxial layer by application of a first heat treatment;

forming a gate insulator over the epitaxial layer;

forming a control gate structure over the gate insulator at the location for the transistor gate; and forming source or drain regions by implanting dopants of a second conductivity type with at least the control gate structure as an implant mask, the source or drain regions being formed in at least the epitaxial layer and to a side of the control gate structure; wherein the well extends lower into the substrate than the shallow halo regions.

18. The method of claim 17, wherein:

diffusing at least a portion of the dopants of the source or drain regions from the epitaxial layer into the substrate below the epitaxial layer by application of a second heat treatment.

19. The method of claim 17, further including:

prior to forming the gate mask, forming a threshold voltage adjust region by implanting dopants of the second conductivity type into the well.

20. The method of claim 17, wherein:

forming the source or drain regions includes forming source-drain extension regions by implanting dopants of the second conductivity type with the control gate structure as an implant mask, forming gate spacers that extend the control gate structure in a lateral direction, the lateral direction being parallel to a substrate surface, and forming deep source-drain regions by implanting dopants of the second conductivity type with the control gate structure and gate spacers as an implant mask.

* * * * *